(12) United States Patent
Caveney et al.

(10) Patent No.: US 7,182,649 B2
(45) Date of Patent: Feb. 27, 2007

(54) INDUCTIVE AND CAPACITIVE COUPLING BALANCING ELECTRICAL CONNECTOR

(75) Inventors: Jack E. Caveney, Hinsdale, IL (US); Scott Lesniak, Lockport, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 11/014,097

(22) Filed: Dec. 15, 2004

(65) Prior Publication Data

US 2005/0136747 A1    Jun. 23, 2005

Related U.S. Application Data

(60) Provisional application No. 60/531,756, filed on Dec. 22, 2003.

(51) Int. Cl.
*H01R 24/00* (2006.01)
(52) U.S. Cl. .................... 439/676; 439/620.22
(58) Field of Classification Search ............... 439/188, 439/620, 76.1, 676, 941
See application file for complete search history.

(56) References Cited

U.S. PATENT DOCUMENTS 5,163,836 A    11/1992   Young et al.
5,186,647 A     2/1993   Denkmann et al.

(Continued)

FOREIGN PATENT DOCUMENTS

EP    0 598 192 A1    5/1994

(Continued)

OTHER PUBLICATIONS

U.S. Appl. No. 11/055,344, filed Feb. 10, 2005.

(Continued)

*Primary Examiner*—James R. Harvey
(74) *Attorney, Agent, or Firm*—Robert A. McCann; Zachary J. Smolinski

(57) ABSTRACT

A network cable jack includes a printed circuit board (PCB) for balancing both inductive and capacitive coupling. Using a PCB allows compact trace paths to be formed without significantly increasing manufacturing costs. By including on each trace path two distinct inductance zones separated by a neutral zone, significant gains in degrees of freedom are achieved for designing PCB trace patterns in which a pair of inductive coupling zones jointly offset the inductive coupling caused by a specification plug and the jack contacts, both in magnitude and phase angle. Further, using distinct inductance zones offers more freedom regarding the placement of capacitive plates for use in capacitance balancing as well as the placement of terminals and insulation displacement contacts. Although the magnitude of a capacitive coupling is determined by the length of the capacitor plates parallel to current carrying traces, the approach allows capacitive and inductive coupling to be balanced independently.

10 Claims, 29 Drawing Sheets

U.S. PATENT DOCUMENTS

| | | |
|---|---|---|
| 5,228,872 A | 7/1993 | Liu |
| 5,299,956 A | 4/1994 | Brownell et al. |
| 5,503,572 A | 4/1996 | White et al. |
| 5,586,914 A | 12/1996 | Foster, Jr., et al. |
| 5,716,237 A | 2/1998 | Conorich et al. |
| 5,766,034 A | 6/1998 | Block et al. |
| 5,779,503 A | 7/1998 | Tremblay et al. |
| 5,791,943 A | 8/1998 | Lo et al. |
| 5,797,764 A | 8/1998 | Coulombe et al. |
| 5,885,111 A | 3/1999 | Yu |
| 5,915,989 A | 6/1999 | Adriaenssens et al. |
| 5,997,358 A | 12/1999 | Adriaenssens et al. |
| 6,017,229 A | 1/2000 | Tulley et al. |
| 6,017,247 A | 1/2000 | Gwiazdowski |
| 6,057,743 A * | 5/2000 | Aekins .......................... 333/1 |
| 6,079,996 A | 6/2000 | Arnett |
| 6,120,330 A | 9/2000 | Gwiazdowski |
| 6,155,881 A | 12/2000 | Arnett et al. |
| 6,168,474 B1 | 1/2001 | German et al. |
| 6,176,742 B1 | 1/2001 | Arnett et al. |
| 6,196,880 B1 | 3/2001 | Goodrich et al. |
| 6,231,397 B1 | 5/2001 | de la Borbolla et al. |
| 6,238,235 B1 | 5/2001 | Shavit et al. |
| 6,255,593 B1 | 7/2001 | Reede |
| 6,267,617 B1 | 7/2001 | Nozick |
| 6,305,950 B1 | 10/2001 | Doorhy |
| 6,319,069 B1 | 11/2001 | Gwiazdowski |
| 6,332,810 B1 | 12/2001 | Bareel |
| 6,338,655 B1 | 1/2002 | Masse et al. |
| 6,356,162 B1 | 3/2002 | DeFlandre et al. |
| 6,371,793 B1 | 4/2002 | Doorhy et al. |
| 6,379,157 B1 * | 4/2002 | Curry et al. ................ 439/676 |
| 6,379,175 B1 | 4/2002 | Reede |
| 6,402,560 B1 | 6/2002 | Lin |
| 6,409,547 B1 | 6/2002 | Reede |
| 6,410,845 B2 | 6/2002 | Reede |
| 6,464,529 B1 | 10/2002 | Jensen et al. |
| 6,464,541 B1 | 10/2002 | Hashim et al. |
| 6,524,139 B1 | 2/2003 | Chang |
| 6,533,618 B1 | 3/2003 | Aekins |
| 6,554,638 B1 | 4/2003 | Hess et al. |
| 6,736,681 B2 * | 5/2004 | Arnett ........................ 439/676 |
| 6,769,937 B1 * | 8/2004 | Roberts ...................... 439/676 |
| 6,780,035 B2 | 8/2004 | Bohbot |
| 6,802,743 B2 | 10/2004 | Aekins et al. |
| 2001/0014563 A1 | 8/2001 | Morita et al. |
| 2002/0019172 A1 | 2/2002 | Forbes et al. |
| 2002/0197043 A1 | 12/2002 | Hwang |
| 2003/0171024 A1 | 9/2003 | Mossner et al. |
| 2003/0194908 A1 | 10/2003 | Brown et al. |
| 2004/0184247 A1 | 9/2004 | Adriaenssens et al. |
| 2004/0248468 A1 | 12/2004 | Gurovich et al. |
| 2005/0014420 A1 | 1/2005 | Quenneville et al. |
| 2005/0207561 A1 | 9/2005 | Hammond, Jr. |
| 2005/0208838 A1 | 9/2005 | Horowitz, et al. |
| 2006/0014410 A1 * | 1/2006 | Caveney .................... 439/188 |

FOREIGN PATENT DOCUMENTS

| | | |
|---|---|---|
| EP | 0 901 201 A1 | 3/1999 |
| EP | 1 063 734 A2 | 12/2000 |
| EP | 1 191 646 A2 | 3/2002 |
| EP | 1 275 177 B1 | 1/2003 |
| EP | 1 275 177 B1 | 2/2004 |
| FR | 2 823 606 | 10/2002 |
| FR | 2 823 606 A1 | 10/2002 |
| GB | 2 380 334 A | 4/2003 |
| WO | WO 99/30388 | 6/1999 |
| WO | WO 99/45611 | 9/1999 |
| WO | WO 01/80376 A1 | 10/2001 |
| WO | WO 2004/001906 | 12/2003 |
| WO | WO 2004/001906 A1 | 12/2003 |
| WO | WO 2004/086828 A1 | 10/2004 |
| WO | WO 2005/101579 A1 | 10/2005 |

OTHER PUBLICATIONS

U.S. Appl. No. 11/078,816, filed Mar. 11, 2005.
U.S. Appl. No. 11/099,110, filed Apr. 5, 2005.
U.S. Appl. No. 11/180,216, filed Jul. 13, 2005.

* cited by examiner

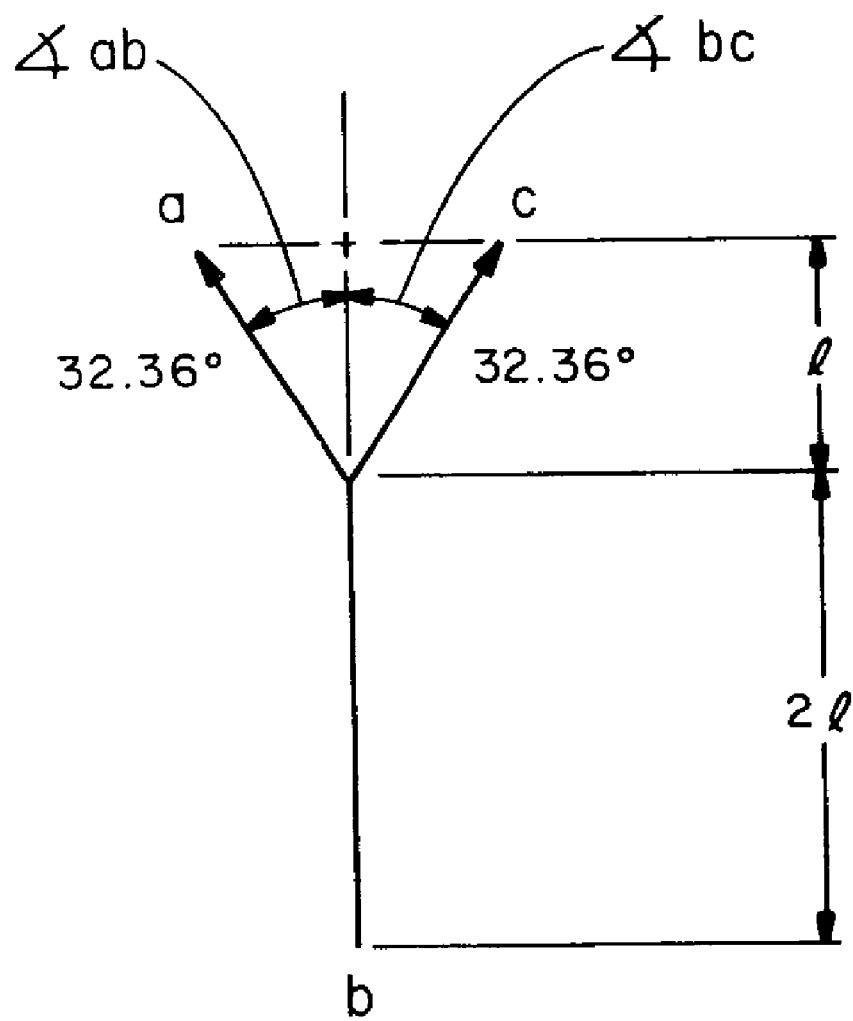
FIG. II

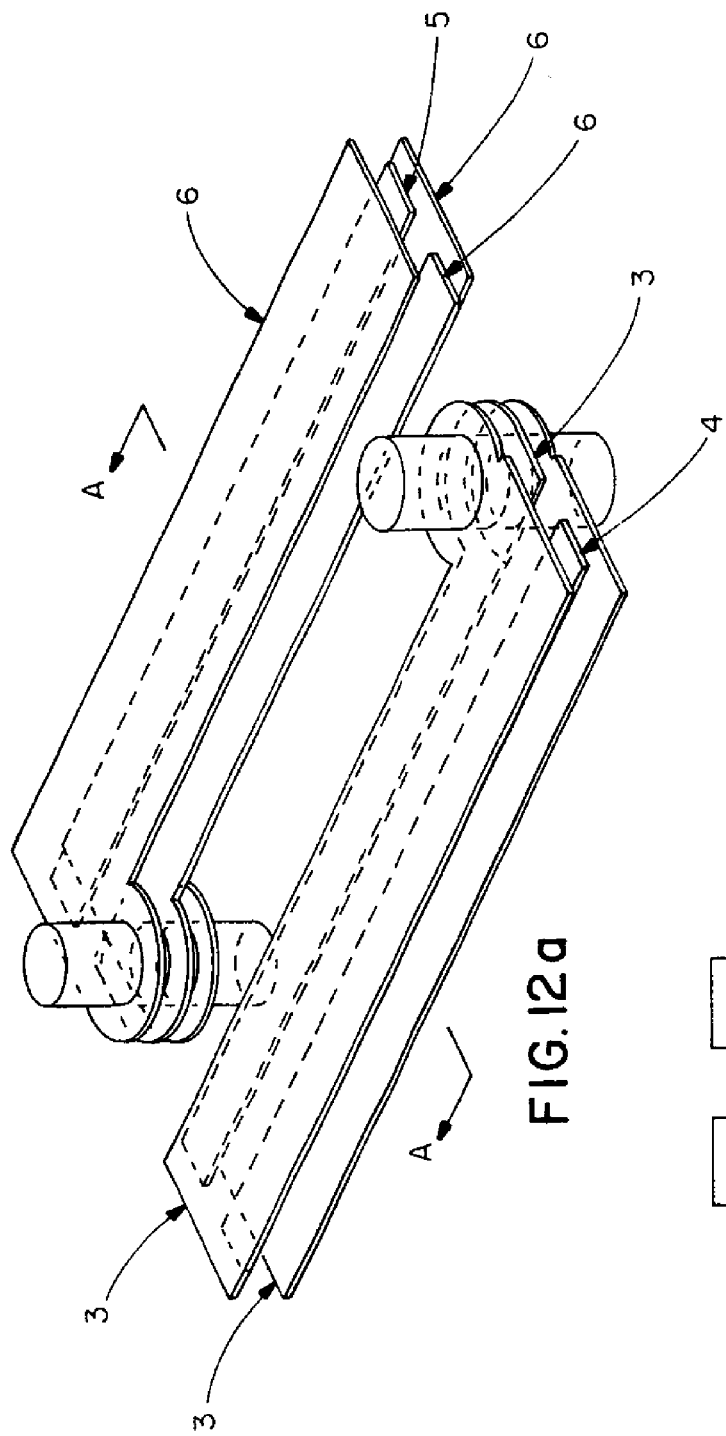
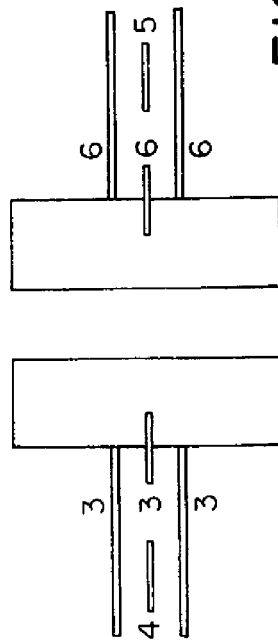
FIG.12a
FIG.12b

INDUCTIVE AND CAPACITIVE COUPLING BALANCING ELECTRICAL CONNECTOR

CROSS-REFERENCE TO RELATED APPLICATIONS

This application claims priority to and incorporates by reference in its entirety U.S. Provisional Application Ser. No. 60/531,756, attorney reference number LCB447, entitled "Inductive and Capacitive Coupling Balancing Electrical Connector," filed on Dec. 22, 2003, as well as all materials incorporated therein by reference. Further, this application incorporates by reference in its entirety U.S. Pat. No. 5,997,358, entitled "Electrical Connector Having Time-Delayed Signal Compensation," filed on Sep. 2, 1997, as well as all materials incorporated therein by reference.

BACKGROUND

The invention is directed generally to an electrical connector and more specifically to an electrical connector having improved inductive and capacitive coupling balancing characteristics.

It has long been desired to improve the electrical performance of particular components or whole systems by minimizing crosstalk therein. There is a reduction in both near end crosstalk (NEXT) and far end crosstalk (FEXT) when both the net inductive and capacitive crosstalk components are reduced in magnitude.

Past efforts to minimize the inductive component of crosstalk have in some cases included altering the length and orientation of the connector contacts to provide offsetting inductive coupling to preexisting inductive coupling present in the plug or elsewhere in the connector. However, the manufacturing processes required to produce contacts having special lengths and orientation are expensive. In addition, such contacts have been relatively long which causes excessive phase shift at high frequency. In addition, the inductance between such contacts are subject to excess variability. In addition or instead of such contact designs, past efforts to minimize crosstalk utilizing phase-offsetting coupling between pairs on a printed circuit board (PCB) have primarily utilized capacitive coupling. As such, better ways of balancing both inductive and capacitive coupling thereby minimizing crosstalk are sought.

SUMMARY

The inventive connector and printed circuit board (PCB) provides an inductance-balancing function with traces on the PCB. It is synergistic in that it utilizes the inductive balancing traces to provide a capacitive-balancing function. This provides advantages over previous designs in terms of ability and cost to achieve a desired result with a compact connector. It also provides greater design flexibility and improved performance.

In some preferred embodiments of the invention, there is provided a jack for receiving a compatibly configured standard plug that terminates four twisted wire pairs. The jack includes a PCB having eight contacts projecting from a front side thereof for mating with the plug, eight insulation displacement contacts (IDC's) projecting from a rear side thereof, and eight traces embedded in the printed circuit board connecting corresponding terminals and IDC's (numbered 1–8 to facilitate reference). Four traces on the PCB are selectively routed in various zones thereof to create two distinct zones of coupling separated by a relatively coupling-free neutral zone. The introduced couplings improve the overall performance of pairs 3,6 and 4,5 of the combination of the jack and the plug.

BRIEF DESCRIPTION OF THE DRAWINGS

FIG. 11 is a schematic vector diagram showing inductive magnitudes and phase angles in accordance with a preferred embodiment of the invention;

FIGS. 12a and 12b shows the addition of capacitor plates to a section of current carrying traces of the PCB shown in FIG. 8;

DETAILED DESCRIPTION OF EMBODIMENTS

Figure 1:
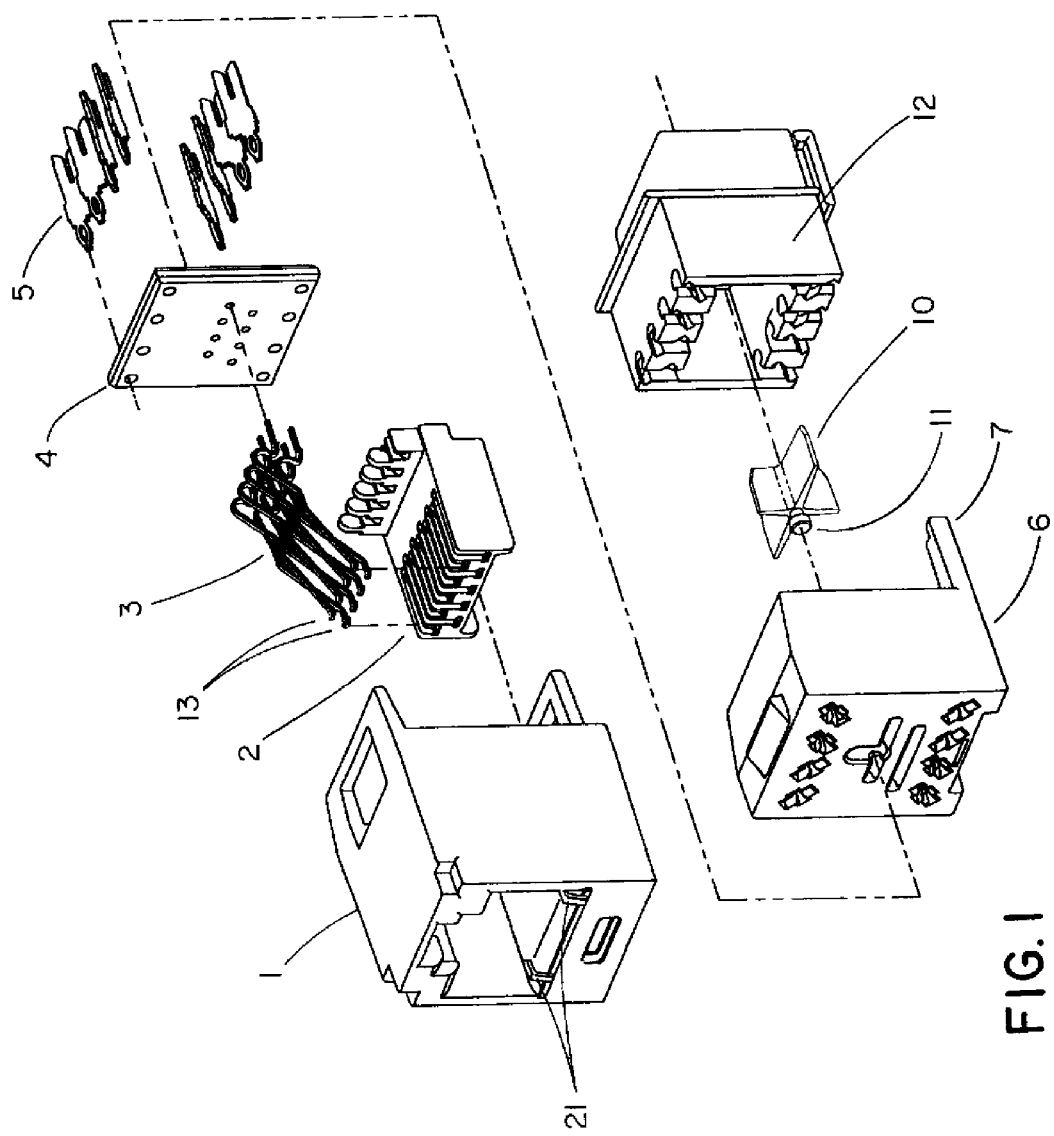
FIG. 1 is an exploded front upper right perspective view of a jack in accordance with an embodiment of the invention.
Figure 2:
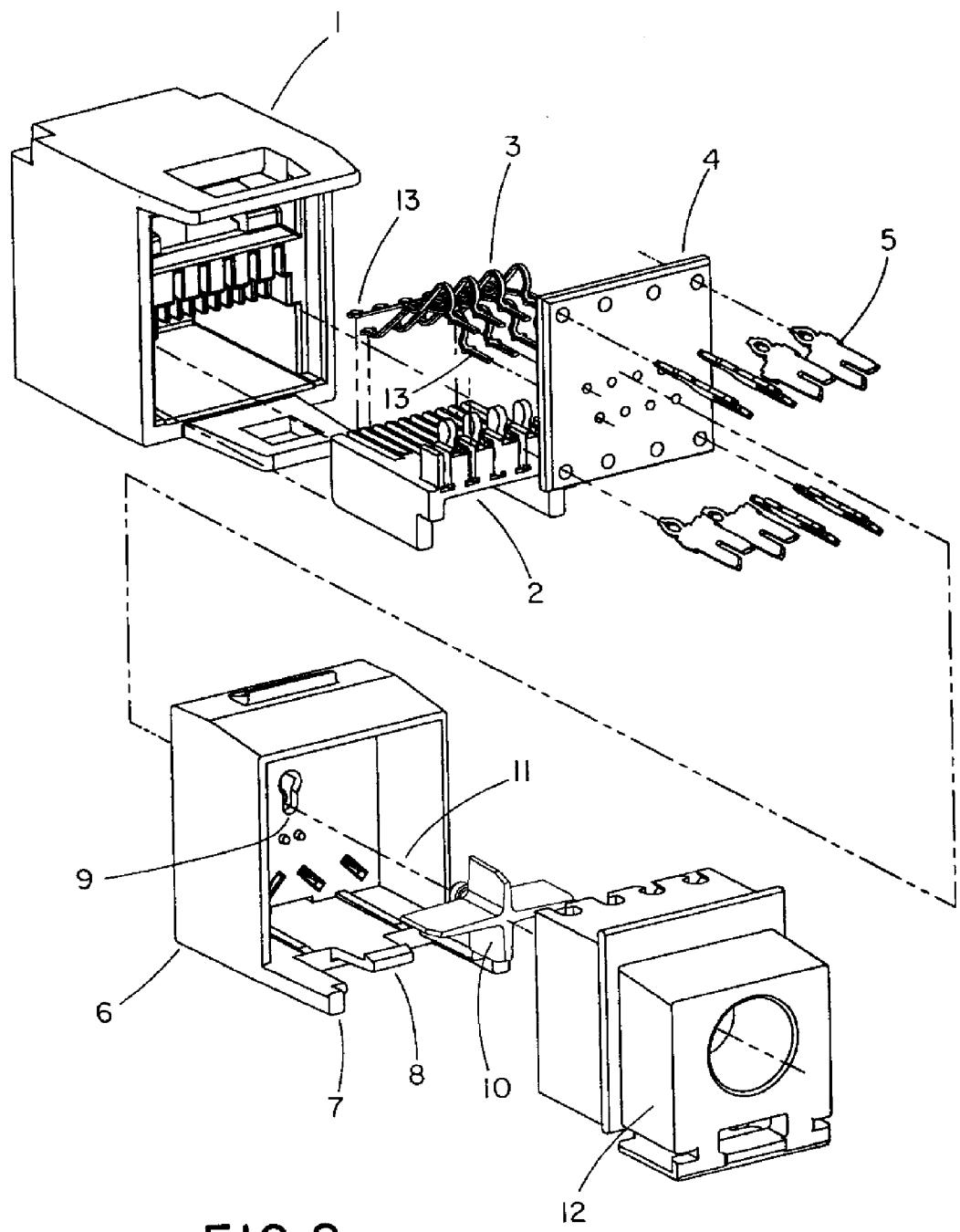
FIG. 2 is a rear upper right perspective view of the jack of FIG. 1.
Figure 3:
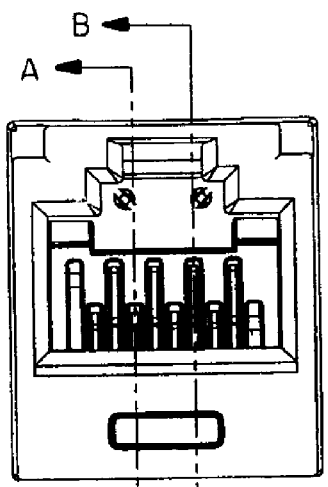
FIG. 3 is a front elevational view of the jack of FIG. 1 in assembled form.
Figure 4:
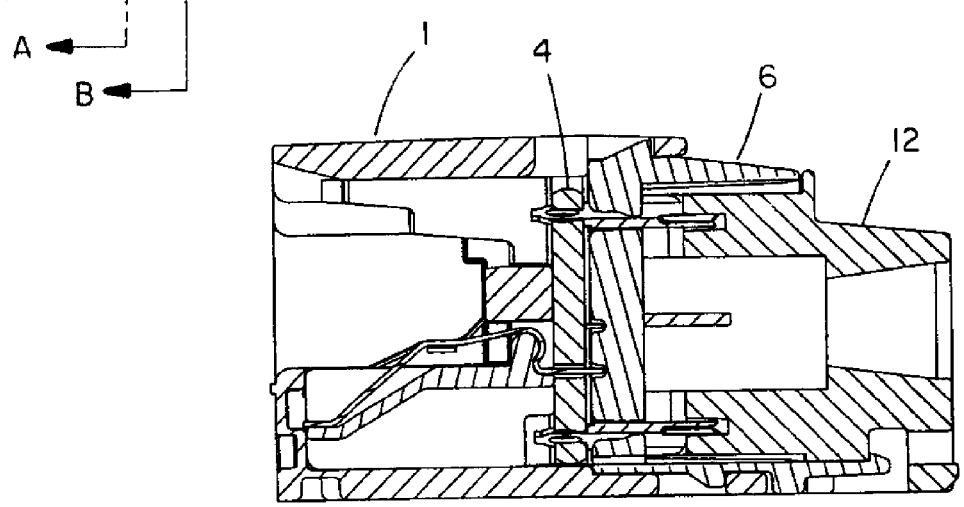
FIG. 4 is a cross-sectional view of the jack of FIG. 3 taken across the line A—A in FIG. 3.
Figure 5:
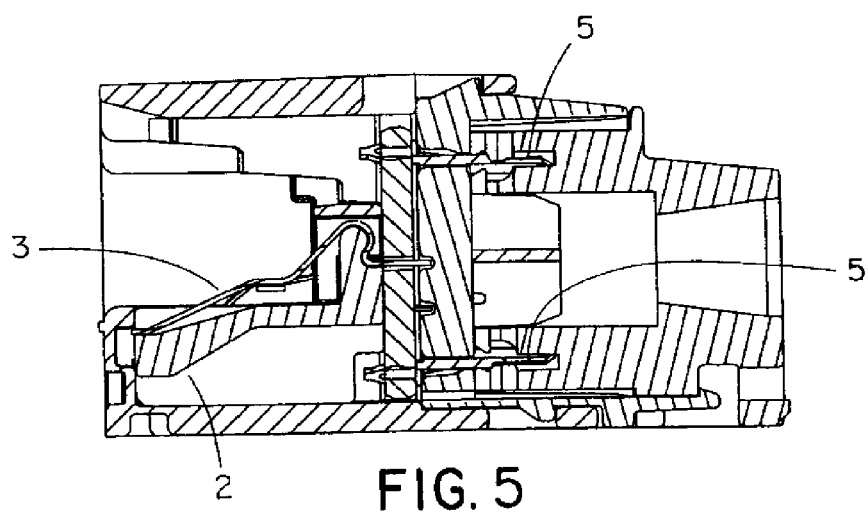
FIG. 5 is a cross-sectional view of the jack of FIG. 3 taken across the line B—B in FIG. 3.
Figure 6:
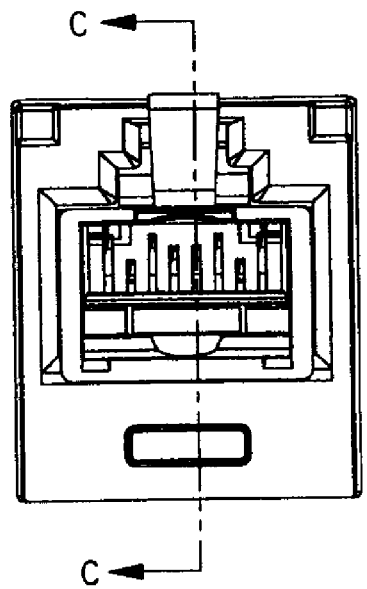
FIG. 6 is a front elevational view of the jack of FIG. 1 with a cooperative plug inserted therein.
Figure 7:
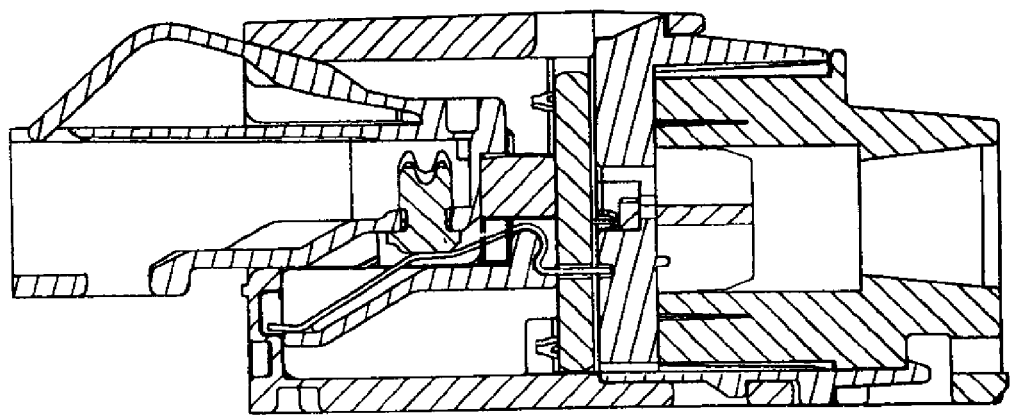
FIG. 7 is a cross-sectional view of the jack of FIG. 6 taken across the line C—C in FIG. 6.

FIGS. 1–7 show a connector that may utilize a coupling balancing circuit board in accordance with the invention. From front to back in the exploded views (FIGS. 1 and 2), there are a main housing 1 and a contact carrier 2 for supporting eight contacts 3 thereon. The contacts preferably engage a PCB 4 from the front in through-hole style, as do eight IDCs 5 from the rear. A rear housing 6 preferably having a pair of guide rails 7 includes passageways for the IDCs, and a wiring cap 12 may preferably include a quartered electrically conductive pair divider 10 for isolating individual wire pairs therein. Unshielded twisted pairs of wires in this area typically have a variable amount of twist which is dependent on the manual installation process. Shielded twisted pairs of wires in this area typically have a variable amount of shield which is dependent on the manual installation process. The divider eliminates crosstalk coupling between the wire pairs in this area. The divider 10 may include a mounting post 11 for mounting the divider within the connector, such as into a keyhole slot 9. A latch 8 may be used for assembling the rear housing 6 and the wiring cap 12.

Figure 8:
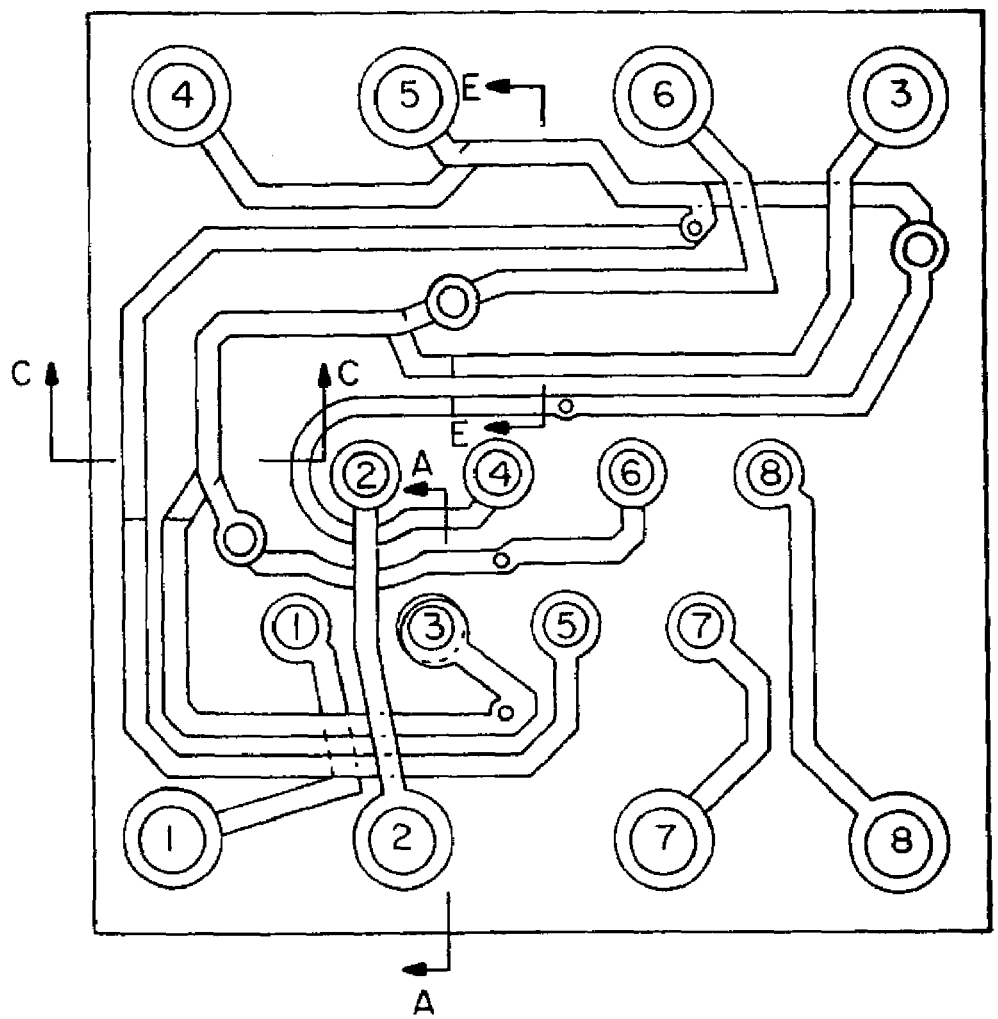
FIG. 8 is a schematic front elevational view of the layout of the current carrying traces of a printed circuit board in accordance with an embodiment of the invention.
Figure 9B:
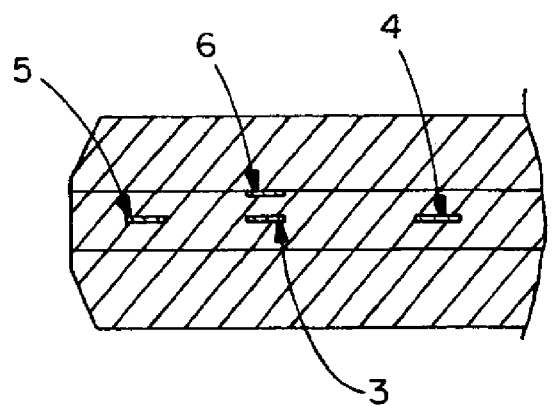
FIG. 9b is a schematic cross-sectional view of the printed circuit board of FIG. 8 taken across the line C—C in FIG. 8.
Figure 9A:
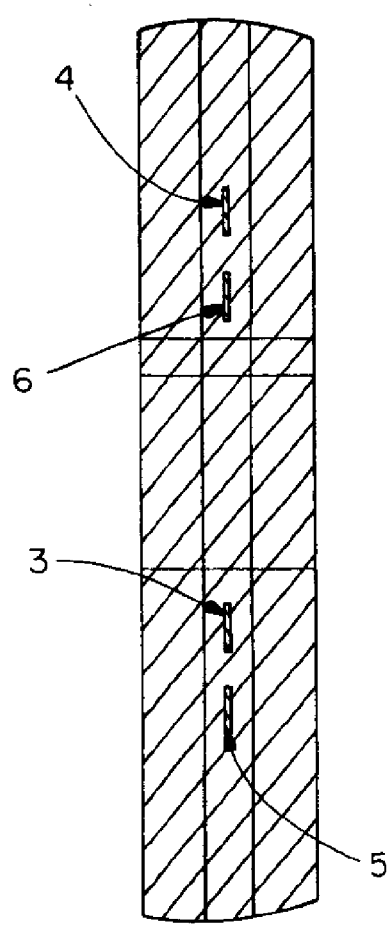
FIG. 9a is a schematic cross-sectional view of the printed circuit board of FIG. 8 taken across the line A—A in FIG. 8.
Figure 9C:
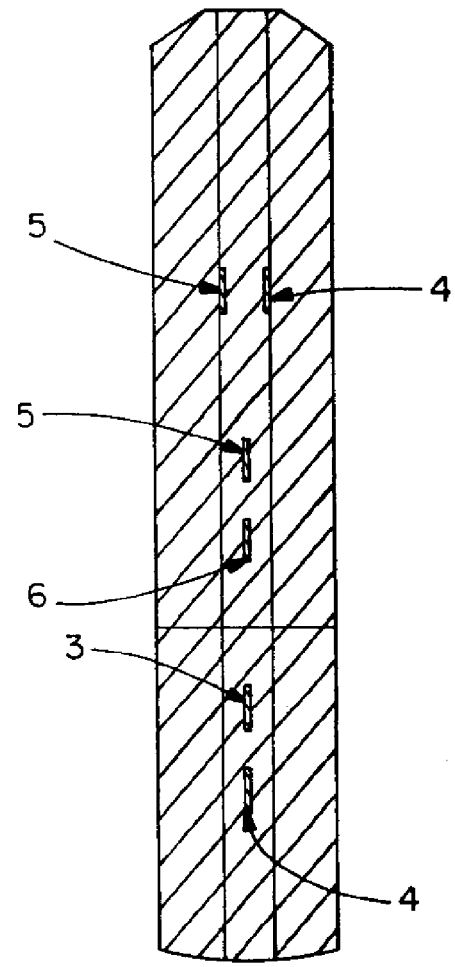
FIG. 9c is a schematic cross-sectional view of the printed circuit board of FIG. 8 taken across the line E—E in FIG. 8

FIGS. 8 and 9 show the PCB traces between correspondingly numbered contact holes and IDC holes, wherein specific trace cross-sectional layouts are shown within the compensation zone (FIG. 9a), the neutral zone (FIG. 9b), and the crosstalk zone (FIG. 9c). As a result of these cross-sectional trace designs, inductive coupling is purposefully introduced between particular wire pairs within the compensation and crosstalk zones, while the neutral zone is generally free of purposefully introduced coupling.

Figure 10:
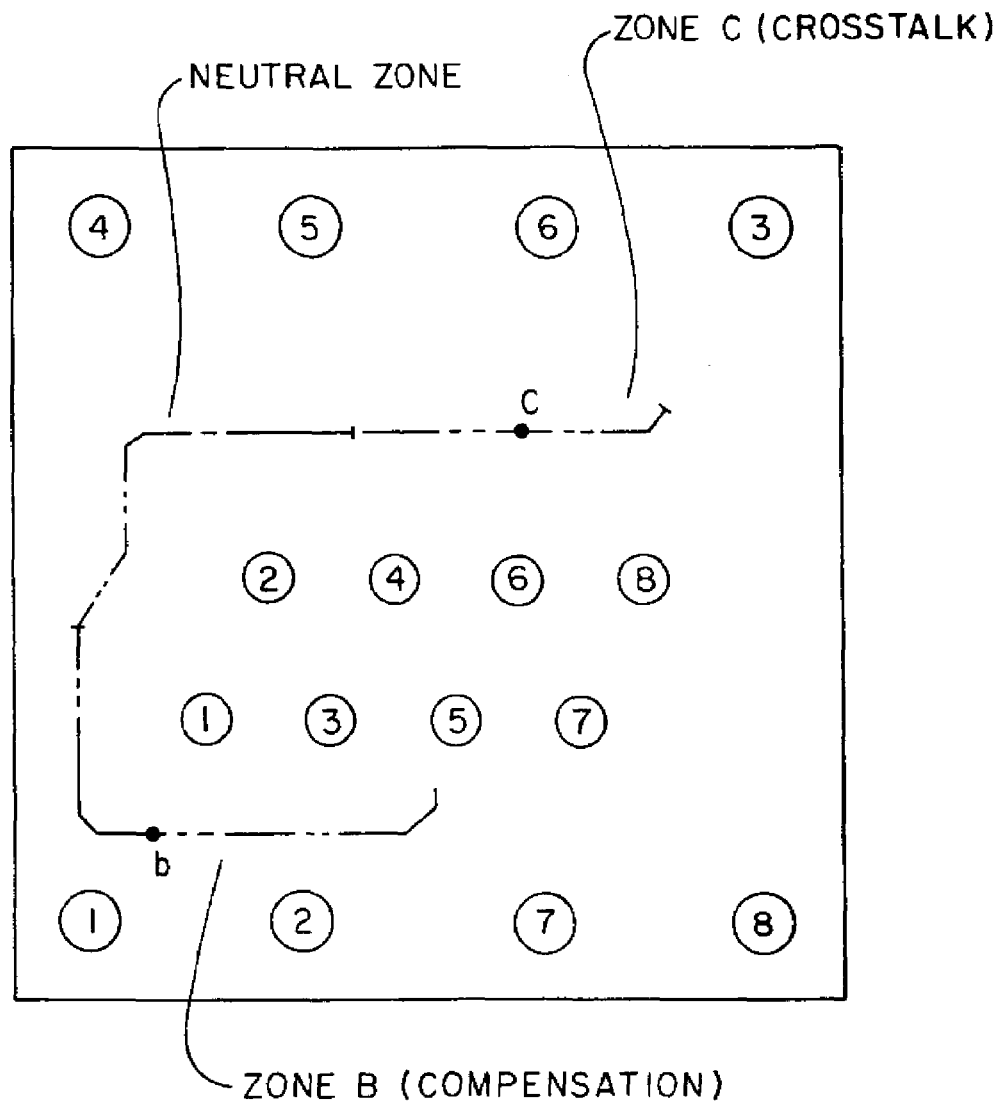
FIG. 10 is a schematic front elevational view of the printed circuit board of FIG. 8 showing inductive zone partitions and inductive vector origin locations.

FIG. 10 schematically shows trace-length zone partitions and/or midpoints to establish inductance vector origin points for calculating net inductive coupling (vector addition based on magnitudes and phase angles of particular inductive coupling zones). FIG. 11 is a schematic vector diagram showing inductive coupling magnitudes and phase angles netting to zero for the particular jack embodiment shown.

Using a PCB to provide inductance balancing is preferable to some conventional inductance balancing techniques (such as contact orientation) in that trace paths on a PCB are compact and inexpensive to attain without incurring significantly increased manufacturing costs. Additionally, using only a single compensation zone, where inductance of a certain magnitude (path length as the paths run in parallel) is purposefully introduced to offset a predetermined inductance from a plug or other portion of the connector is ineffective at high frequencies due to phase shift. The inventive connector utilizes the teachings of U.S. Pat. No. 5,997,358 to take phase shift into account. This application incorporates by reference in its entirety U.S. Pat. No. 5,997,358. By including two distinct inductance zones, however, separated by a neutral zone, one realizes significant gains in degrees of freedom for designing trace patterns on a PCB so that the pair of inductive coupling zones jointly offset the inductive coupling caused by a specification plug and the jack contacts both in magnitude and phase angle.

In a preferred embodiment of the invention, an electrical path may extend from the plug through the portion of a contact between the plug contact point and the contact through-hole on the PCB, along a precompensation portion of a trace, into a compensation zone of the trace, into a neutral zone of the trace, into a crosstalk zone of the trace, and into a corresponding IDC. Particular traces are run closely together in the compensation and crosstalk zones so as to introduce inductive coupling between particular trace pairs in these zones, while the precompensation zone and neutral zone are generally devoid of any intentionally introduced inductive coupling between trace pairs. The lengths of the various trace portions are subject to design considerations but are generally chosen to provide path lengths within the various zones so that the inductive coupling provided by the compensation and crosstalk zones and their locations combine to generally offset the inductive couplings in the plug and jack contacts.

Although there are several degrees of freedom in designing this system, the inclusion of the neutral zone, in particular, between the two inductance zones (the compensation zone and the crosstalk zone), yields considerable freedom in designing the through-hole locations and trace paths on the PCB, and thus offers more freedom pertaining to where the terminals and IDC's may be located on the PCB. It also provides more options for the introduction of capacitance on the PCB so that it also serves a capacitance balancing function.

In a preferred embodiment as shown in FIG. 10, the printed circuit board design taught herein has three zones of inductive coupling between pairs 3,6 and 4,5. There is a compensation zone (zone b) and a crosstalk zone (zone c) and the magnitude of these couplings can be adjusted by the length of the zones. There is also a neutral zone which has minimal net coupling between pairs and its length can be adjusted.

FIG. 11 is a vector simulation of this embodiment.

The vectors in FIG. 11 simulate the following:

Vector a: The crosstalk of the plug and the crosstalk of the jack contacts with their phase shift relative to the center (inductive coupling center) of the compensation zone.

Vector b: The compensation of the printed circuit board compensation zone, the b vector, is all effectively located at the center of this zone.

Vector c: The crosstalk of the printed circuit board crosstalk zone adjusted for the crosstalk of the IDC's, the c vector, is all effectively located at the center of this zone with their phase shift relative to the center of the compensation zone.

The phase shift due to the distance and environment between b & c is equal to the phase shift due to distance and environment between a & b. As seen in FIG. 11, with this design, ab=bc, the length of vector a equals the length of vector c and the vertical component of vector a plus the vertical component of vector c equals the length of vector b at a Null Frequency of 500 MHz. The ideal results, as illustrated schematically by FIG. 11, can be attained by the independent adjustment of bc by adjusting the length of the Neutral Zone and by adjusting the magnitudes of vectors b & c.

Figure 13:
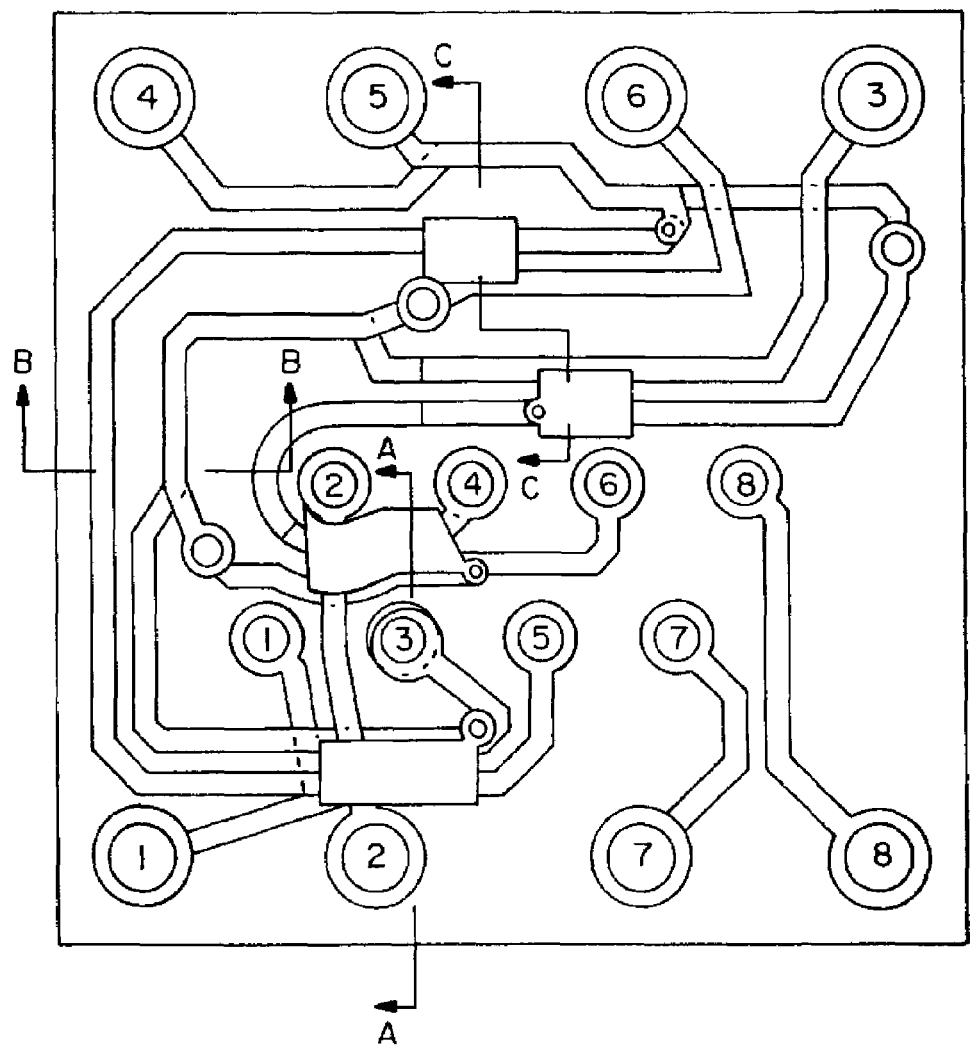
FIG. 13 is a schematic front elevational view of the layout of the PCB shown in FIG. 8 with the addition of capacitor plates.

The objectives of the design of the jack as shown in FIG. 1 with a PCB as shown in FIG. 13 is to compensate for the crosstalk between pairs 3,6 and 4,5 of a specification Cat. 6 plug caused by both inductive and capacitive coupling.

The current carrying traces on the PCB provide capacitive coupling in the compensation and crosstalk zones which is similar to the inductive coupling which they provide, however, additional capacitive coupling is required. This is provided by selectively adding capacitor plates above and below sections of current carrying leads as shown in FIGS. 12–14.

FIGS. 12a and 12b shows the addition of capacitor plates to a section of current carrying traces of the PCB shown in FIG. 8.

FIG. 13 is a schematic front elevational view of the layout of the PCB shown in FIG. 8 with the addition of capacitor plates.

Figure 14B:
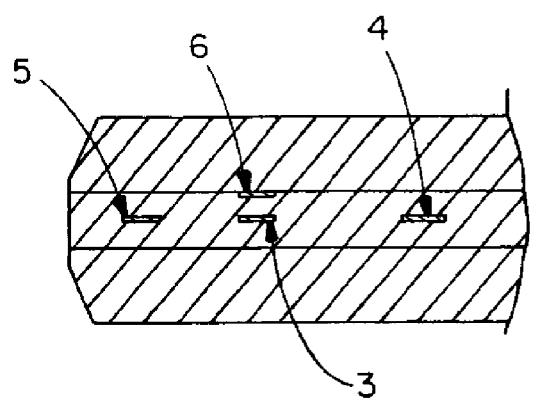
FIGS. 14a, 14b, and 14c are schematic cross-sectional views of the PCB of FIG. 13 taken across the lines A—A, B—B and C—C in FIG. 13.
Figure 14A:
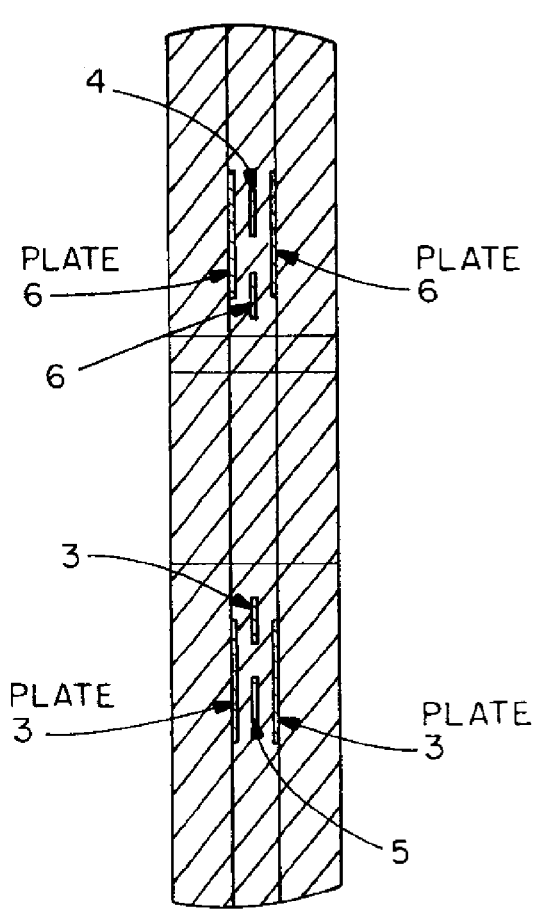
Figure 14C:
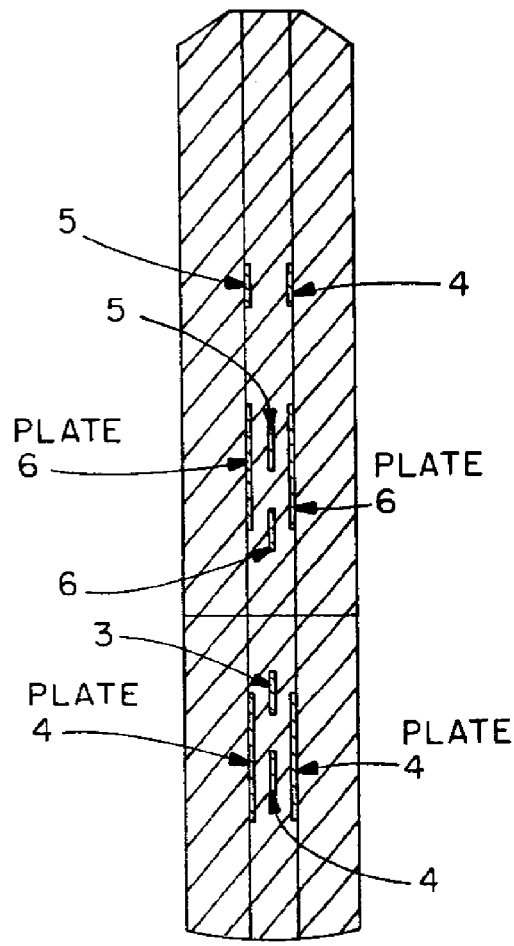

FIG. 14 is a schematic cross-sectional view of the PCB of FIG. 13 taken across the line A—A in FIG. 13.

This design provides relatively compact PCB geometry. It utilizes current carrying traces to provide the required inductive and capacitive coupling in both the compensation and crosstalk zones.

The location of each capacitive coupling is controlled by the location of the connection between a current carrying trace and the associated capacitor plates. The magnitude of each capacitive coupling is determined by the length of the capacitor plates parallel to the current carrying traces.

The capacitive coupling vector origin locations are proximate the inductive coupling vector origins, however, the inductive and capacitive couplings are independently balanced.

The couplings of the specification plug have been calculated as follows:

| Inductive Coupling: | 1.428 nH |
|---|---|
| Capacitive Coupling: | .936 pF |

The design parameter objectives of the jack PCB design are:

| Zone | Zone Length | Inductive Coupling | Capacitive Coupling |
|---|---|---|---|
| Compensation | .297" | 3.09 nH | 1.812 pF |
| Neutral | .250" | 0 | 0 |
| Crosstalk | .176" | 1.830 nH | 1.046 pF |

Vector Angle AB = Vector Angle BC = 32.36°

This design was determined by simulation and calculation and is the basis for the design of a prototype. To tune the prototype, a plot of NEXT dB vs. frequency should be run. First, the length of the neutral zone should be varied until the Null (−dB) is maximized. Assuming that the magnitude of vector a equals the magnitude of vector b, this will make ab equal to bc. Second, the magnitude of the compensation zone should be varied until the Null frequency is 500 MHz. If the length of the compensation zone is varied to vary its magnitude, the length of the neutral zone must also be varied to make <ab equal to <bc. It should be noted that the crosstalk and compensation provided by the PCB will be a combination of inductive and capacitive coupling and the ideal combination will match the combination of a standard plug and the jack contacts.

The teachings taught herein can also be applied to additional pair combinations. State of the art methods would be used to obtain optimum pair impedance and balance to neutral of each pair.

Figure 16A:
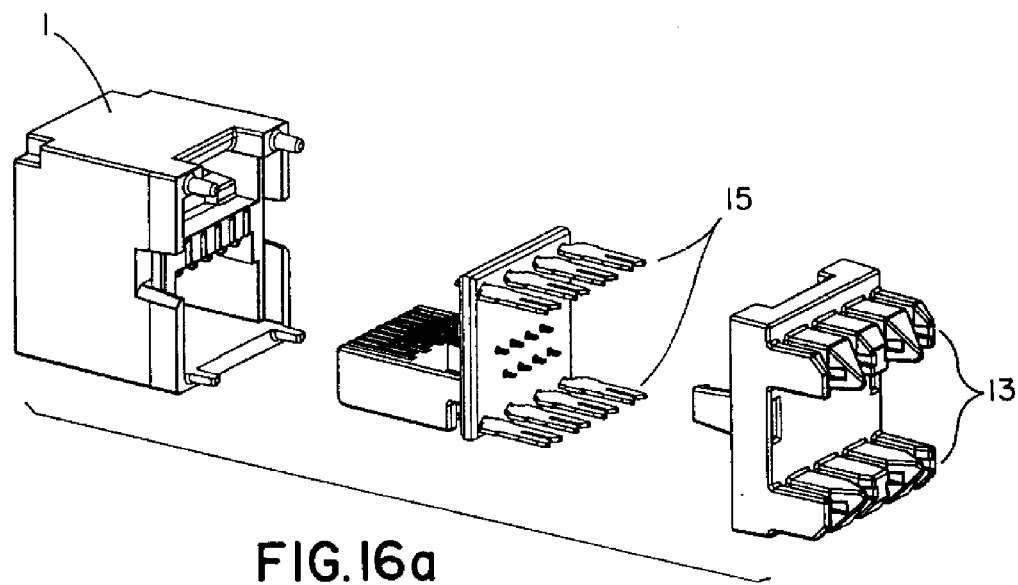
FIGS. 16a and 16b are exploded perspective views of the jack of FIG. 14.
Figure 16B:
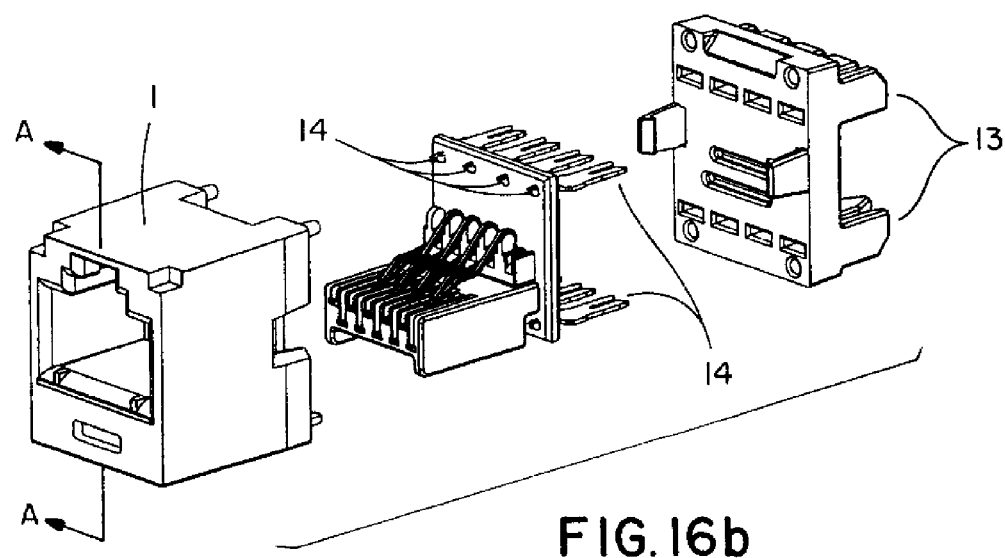
Figure 17:
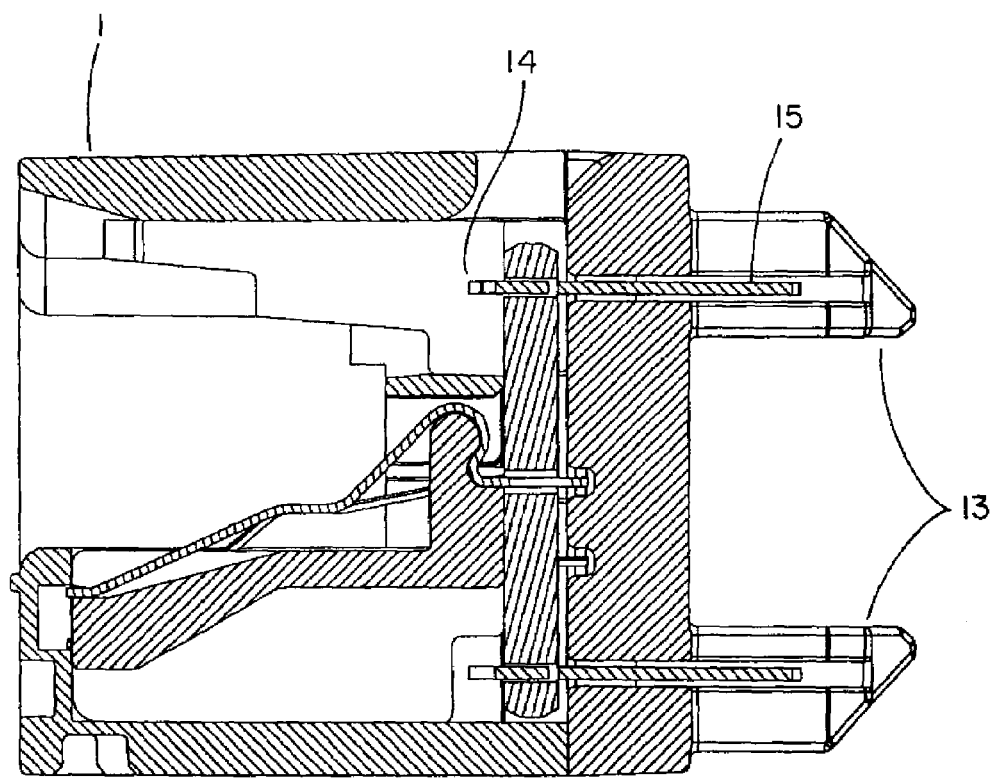
FIG. 17 is a cross-sectional view of the jack of FIG. 16 taken across the line A—A in FIG. 16b.

The same PC board will also accommodate the IDC's for a punchdown termination design as illustrated in FIGS. 15–17.

Figure 15A:
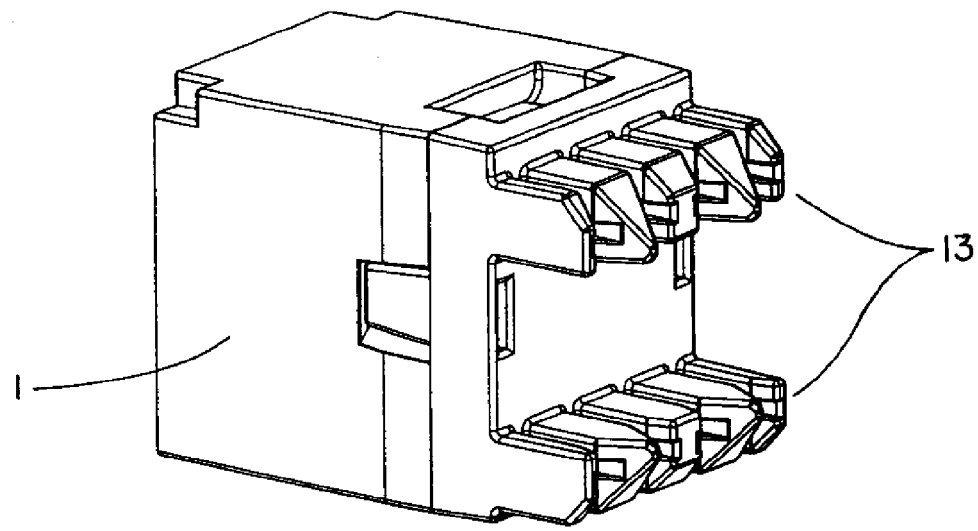
FIGS. 15a and 15b are perspective views of a jack like that illustrated in FIG. 1 except the cable termination cap has been replaced with permanent punchdown blocks which are used for a punchdown cable termination method.
Figure 15B:
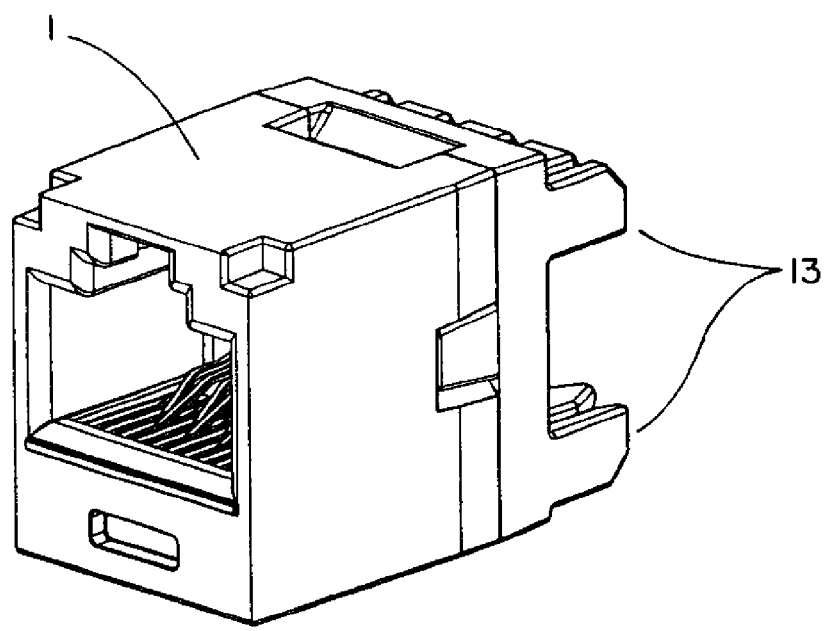

FIGS. 15a and 15b are perspective views of a jack which is similar to that shown in FIG. 1, however, the wiring cap 12 has been replaced with punchdown termination blocks 13.

The main housing 1 is substantially the same as the jack shown in FIG. 1.

FIGS. 16a and 16b are exploded perspective views of the jack shown in FIGS. 15a and 15b.

The stems of the IDC's 14 are the same as those of the jack of FIG. 1, however, the locations and orientations of the IDC blades 15 have been altered. In this manner, preferred IDC blade locations and orientations are attained for both a wiring cap and punchdown blocks with a common PCB.

FIG. 17 is a cross-sectional view of the jack of FIG. 16 taken across the line A—A in FIG. 16b.

Figure 18:
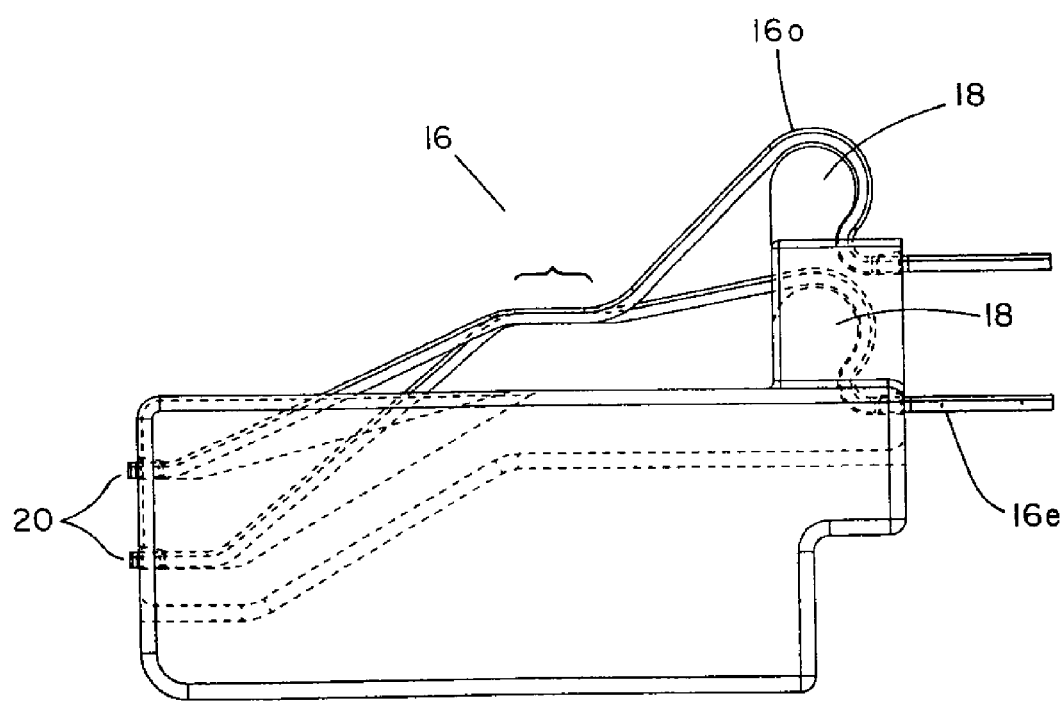
FIG. 18 is a side view of the contacts and contact holder of the jack of FIG. 6.

FIG. 18 shows one embodiment of jack contacts 16 and contact holder 17. The construction of the contacts and contact holder maintains the contacts in the contact holder before and after assembly of the contact holder into the jack housing. In this embodiment, all the odd numbered jack contacts 16o have one unique shape. The even numbered jack contacts 16e have another unique shape and all contacts have unique cross-section dimensions, to provide the required contact force with a relatively short conductive path from an installed plug to the printed circuit board, without permanent deformation of contacts.

In addition, the contact holder 17 incorporates a radiused support 18 under each contact 16 which reduces stress concentration in each contact.

The contact shape is relatively horizontal in the section 19 that contacts the plug to minimize the change in contact force due to allowable dimensional variations in specification plugs.

The ratio of contact width to contact thickness is approximately 1.8:1. This ratio for typical state of the art rectangular contacts is 1.3:1. The free ends of the contacts 20 are supported.

If a six contact plug were installed in a jack with the above contacts, contacts number one and eight would be damaged. To prevent this, protrusion keys 21 in FIG. 1 are included in the jack housing in the contact number one and eight locations which prevent the installation of a six contact plug.

Figure 19:
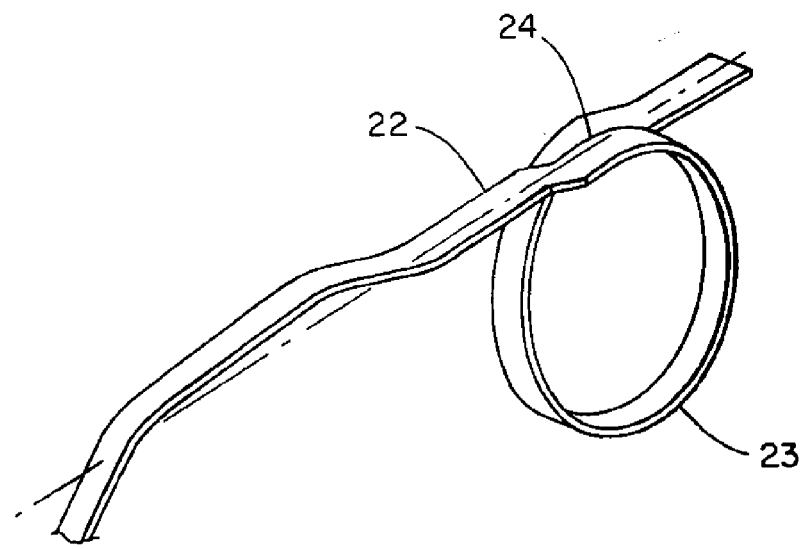
FIG. 19 is a perspective view of an alternate design of one of the outside contacts of FIG. 18.

In another embodiment as shown in FIG. 19, contact 22 has an alternate design to facilitate installation of a six position plug without contact damage. A contact 22 is installed in the number 1 and 8 contact position. This contact design includes a unique "safety pin" loop 23 which electrically contacts itself where the contact is adjacent to itself at 24 to provide a short conductive path between the plug and the PCB coupled with mechanical flexibility.

Figure 20A:
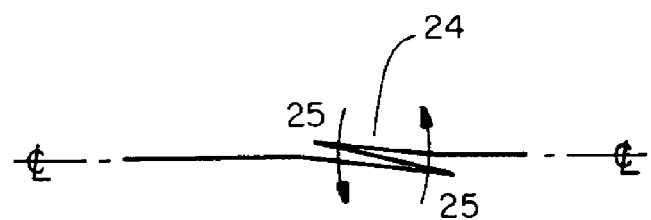
FIGS. 20a and 20b are schematic drawings of the contact of FIG. 19.
Figure 20B:
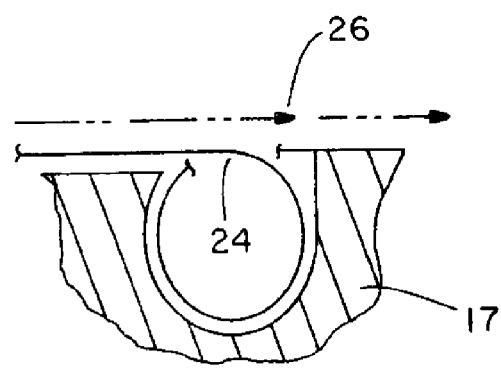

FIGS. 20a and 20b are schematic drawings of the contact of FIG. 19. The "safety pin" loop 23 is constrained in the contact holder 17 and twisted as shown by the arrows to insure electrical contact at 24 to provide current path 26.

The contact 22 of FIG. 19 is designed to minimize the length of the conductive path from the plug to the printed circuit board and in addition to survive the installation of a six contact plug in the eight contact jack.

As shown in FIGS. 21–26, there is a metal pair divider 10 which is installed in the jack in the factory. In the field, the cable is installed in the cap 12 and the cap is pressed into opening 28 in the back 6 of the jack, terminating the cable and locating the metal pair divider adjacent to the end of the cable.

Figure 23:
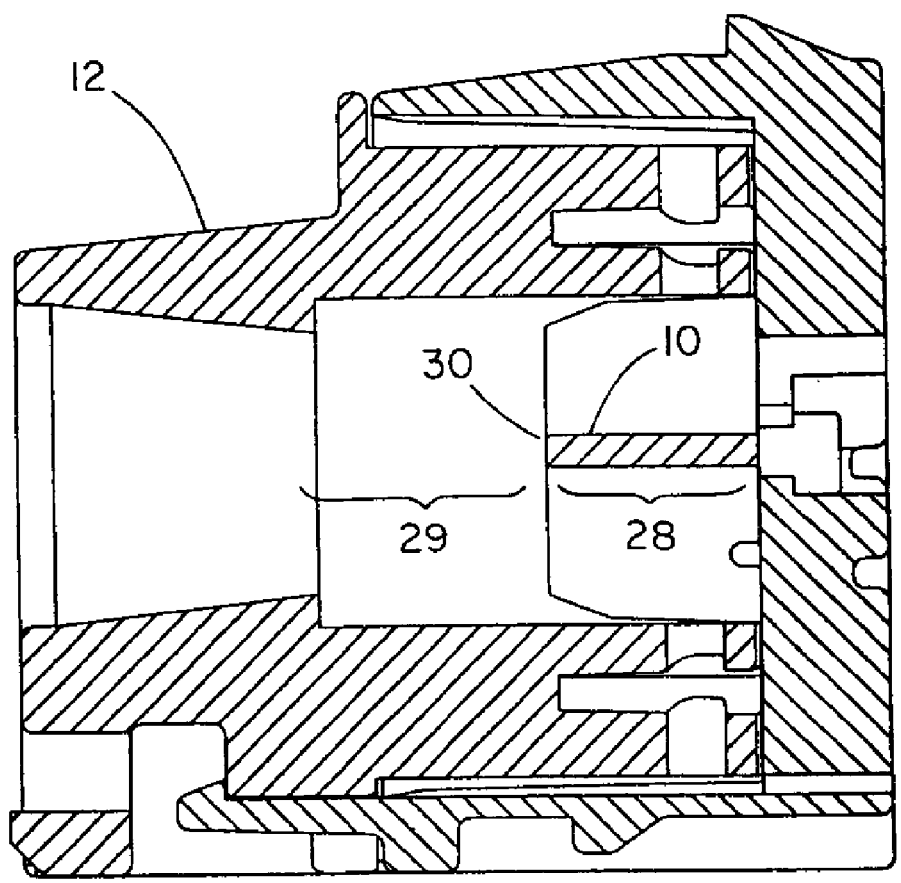
FIG. 23 is a side cross-sectional view of the metal pair divider installed in the rear portion of the jack of FIG. 1.

As shown in FIG. 23, the metal pair divider 10 provides an electrical shield between wire pairs in the area 28 near the end of an installed cable. This portion of the cable typically lacks proper twist of the wires of each pair and/or lacks proper shielding of each pair.

The metal pair divider 10 therefore decreases crosstalk magnitude and variation.

When the cap is installed, there is a space 29 between the end 30 of the metal pair divider 10 and an installed cable jacket which is sufficient to facilitate the necessary reorientation of pairs between the cable jacket and the IDCs.

Figure 21:
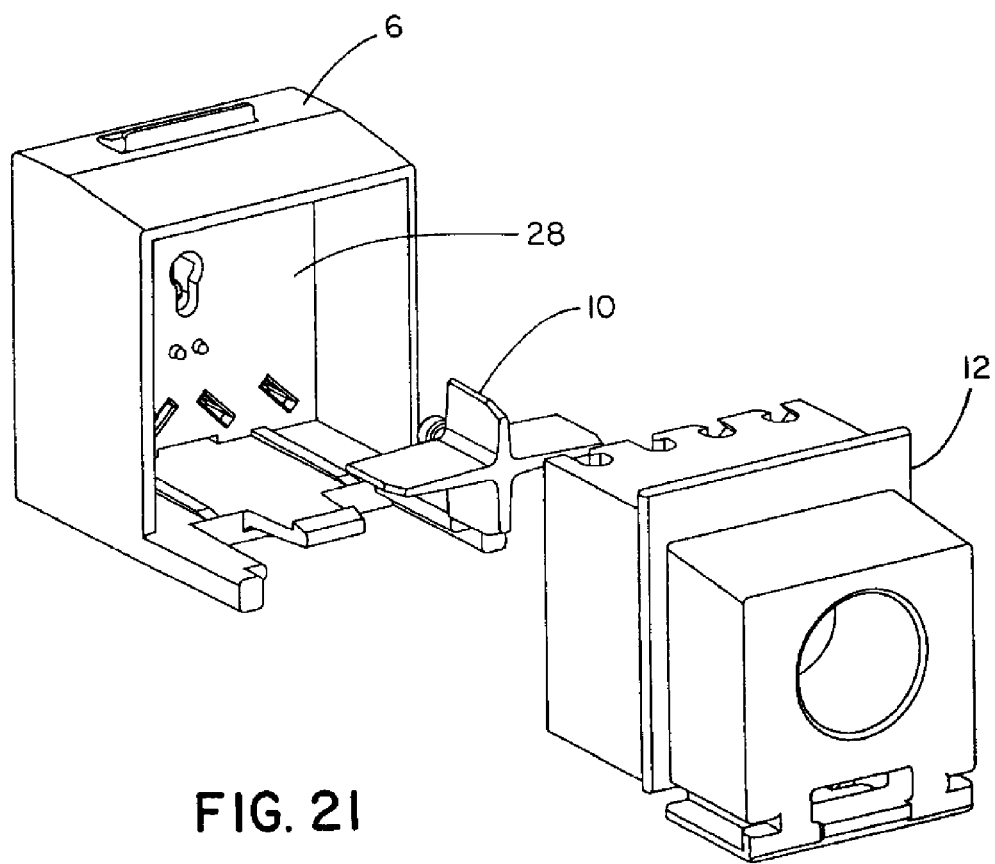
FIG. 21 is an exploded perspective view from the rear of the rear portion of the jack of FIG. 1 including the metal pair divider.
Figure 22:
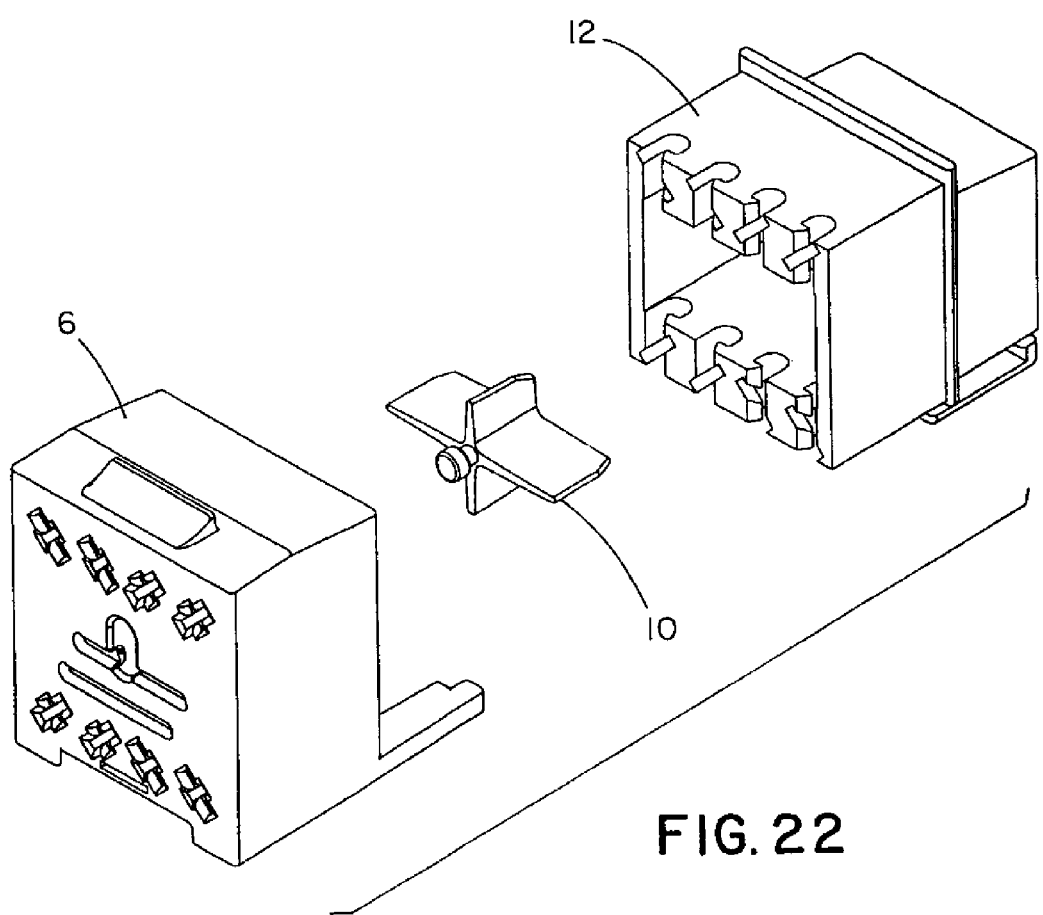
FIG. 22 is an exploded perspective view from the front of the rear portion of the jack of FIG. 1 including the metal pair divider.

FIGS. 21–23 show the rear portion of the non-shielded jack of FIG. 1.

Figure 24:
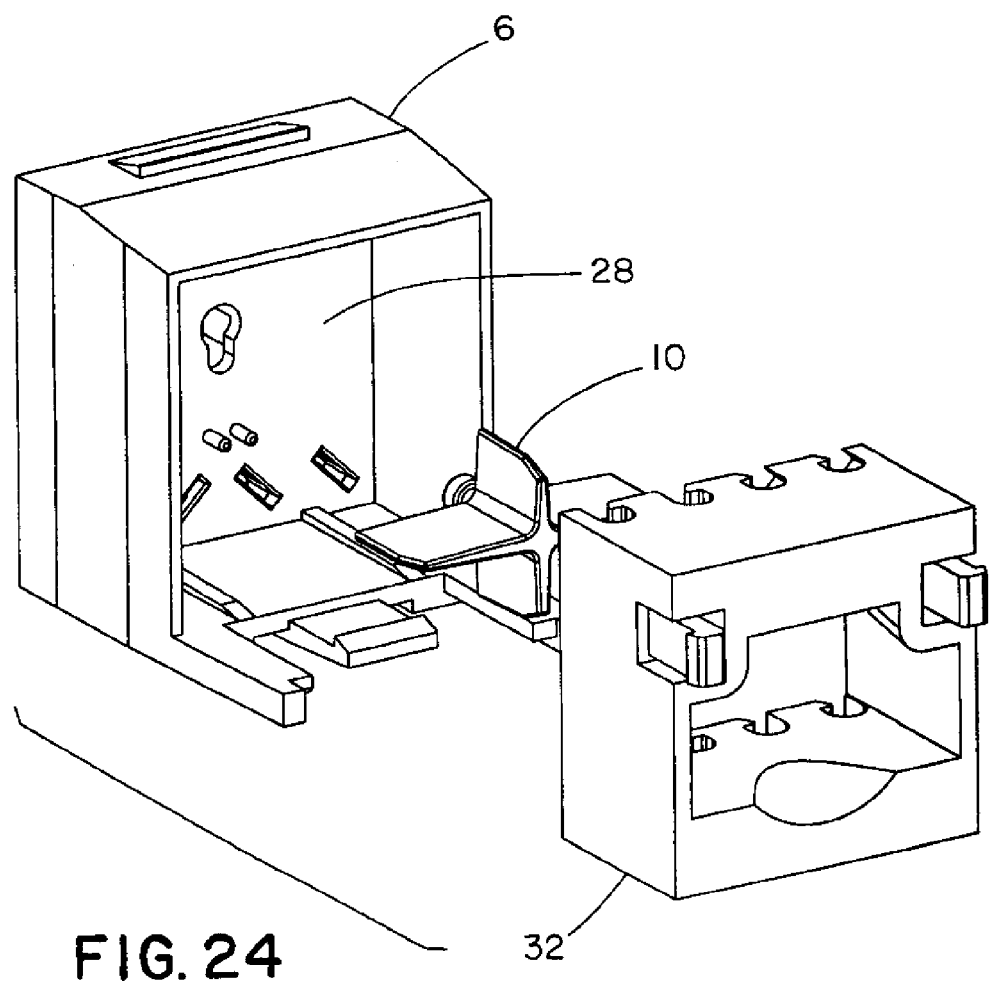
FIG. 24 is an exploded perspective view from the rear of the rear portion of a shielded version of the jack including the metal pair divider.
Figure 25:
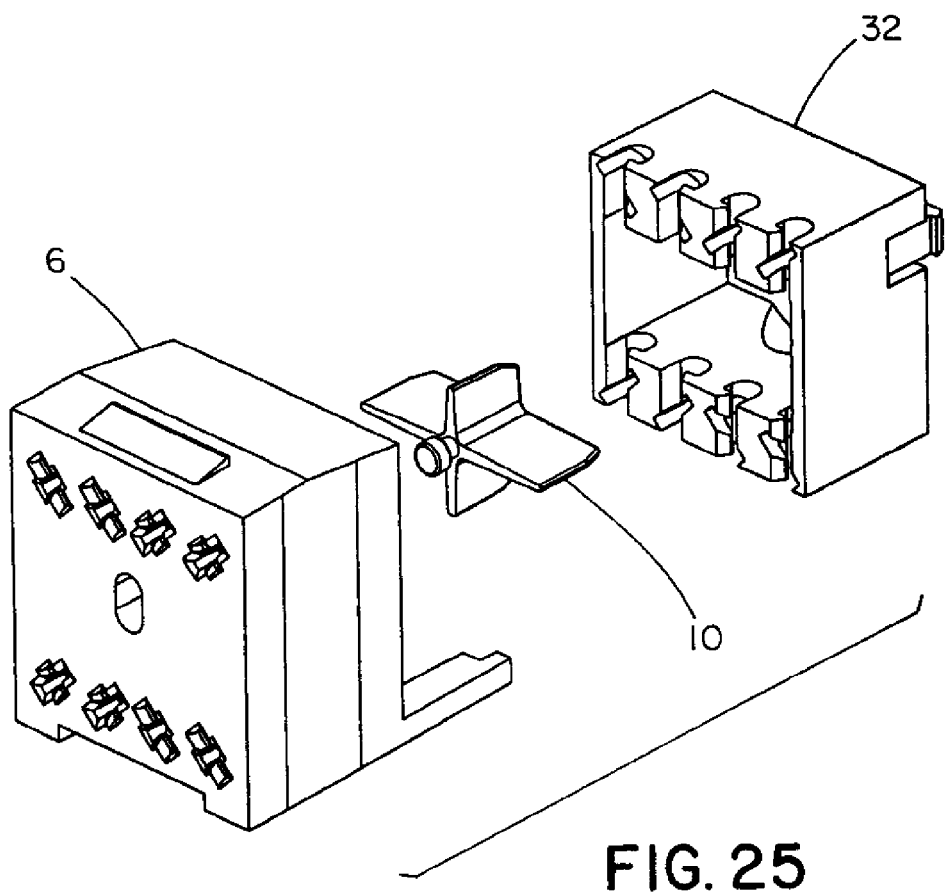
FIG. 25 is an exploded perspective view from the front of the rear portion of a shielded version of the jack including the metal pair divider.
Figure 26:
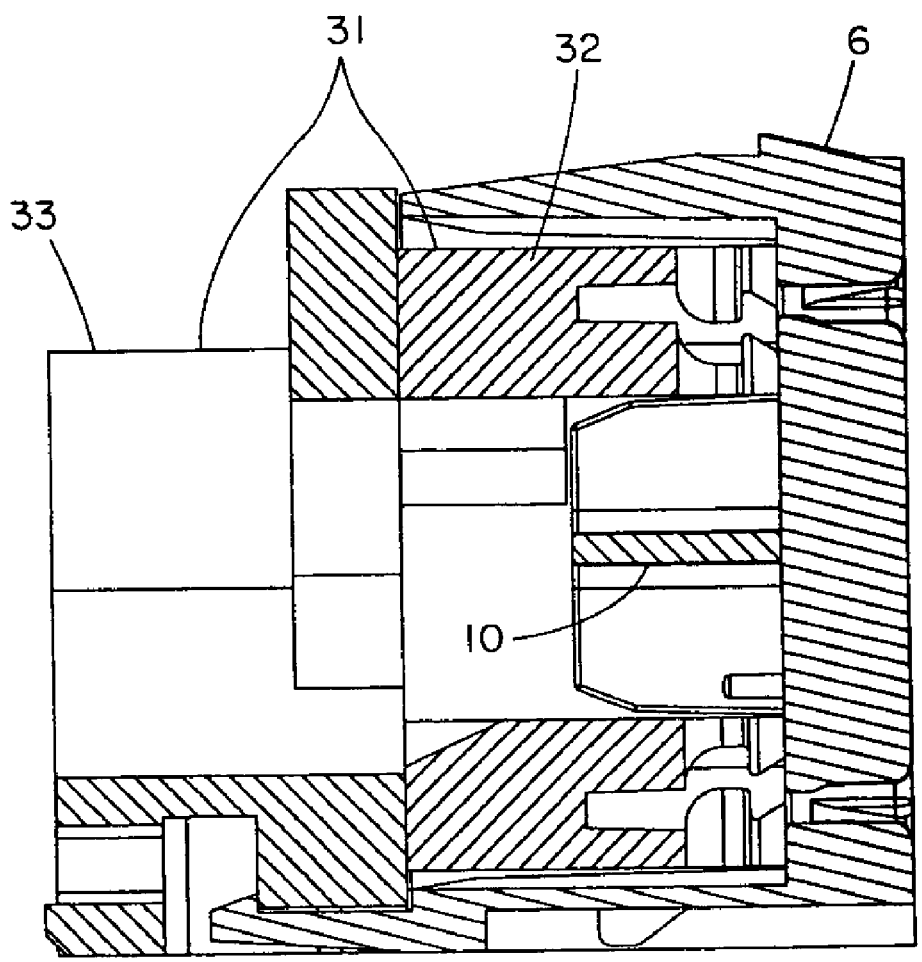
FIG. 26 is a side cross-sectional view of the metal pair divider installed in the rear portion of a shielded version of the jack of FIG. 1.

FIGS. 24–26 show the rear portion of a shielded version of the jack of FIG. 1.

The difference in the shielded version is the replacement of wiring cap 12 with shielded wiring cap 31 shown on FIG. 26 which consists of a plastic portion 32 shown on FIGS. 23–26 and a metal portion 33 shown on FIG. 26.

Figure 27:
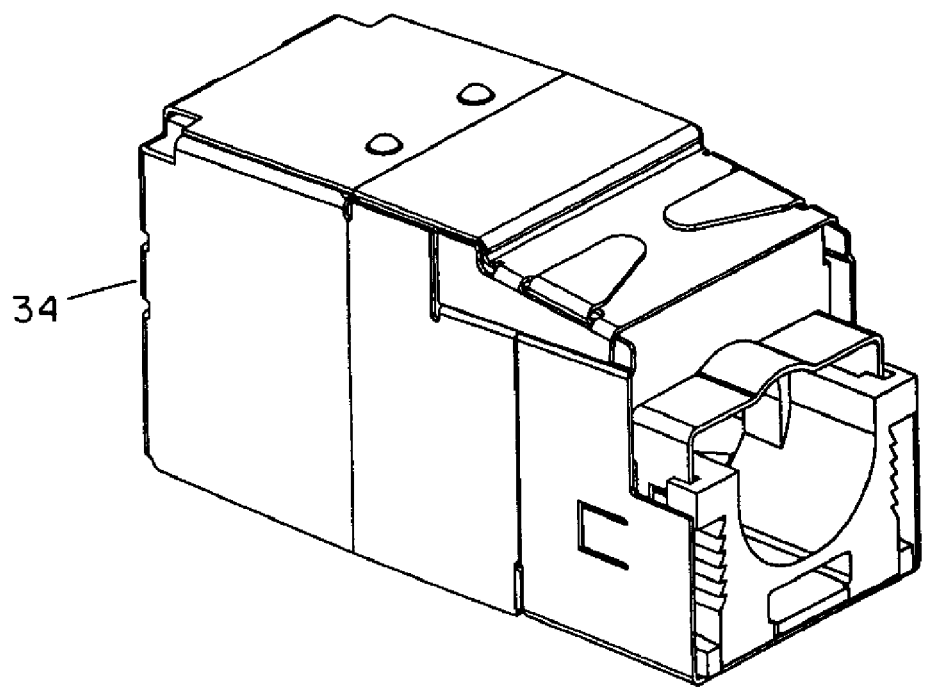
FIG. 27 is a perspective view of a shielded version of the jack of FIG. 1.

FIG. 27 is a perspective view of a shielded version 34 of the jack of FIG. 1.

Figure 28:
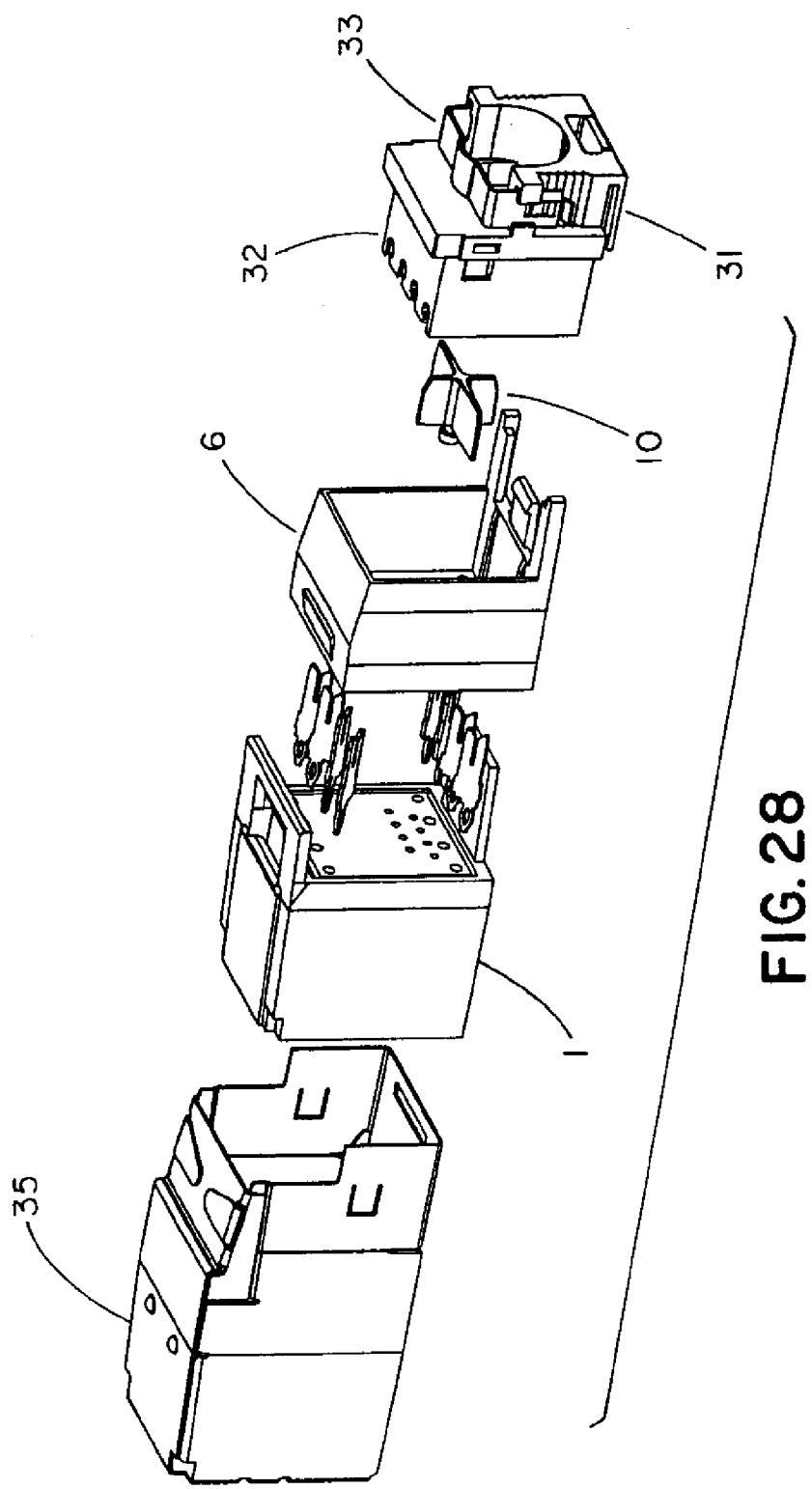
FIG. 28 is an exploded view of the jack of FIG. 27.

FIG. 28 is an exploded view of the jack of FIG. 27 showing the shield 35, the main housing 1, the rear housing 6, the pair divider 10 and the shielded wiring cap 31.

Figure 29A:
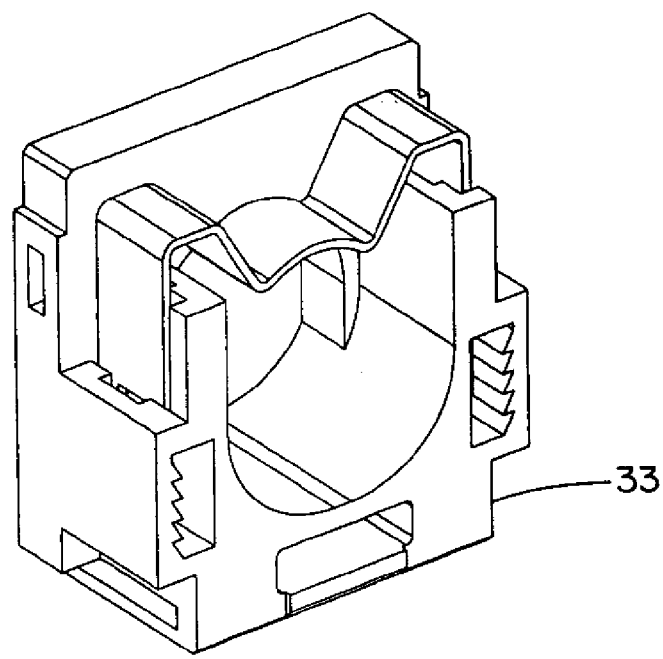
FIGS. 29a and 29b are perspective views of an alternate design of a grounding cap for the jack of FIG. 27.
Figure 29B:
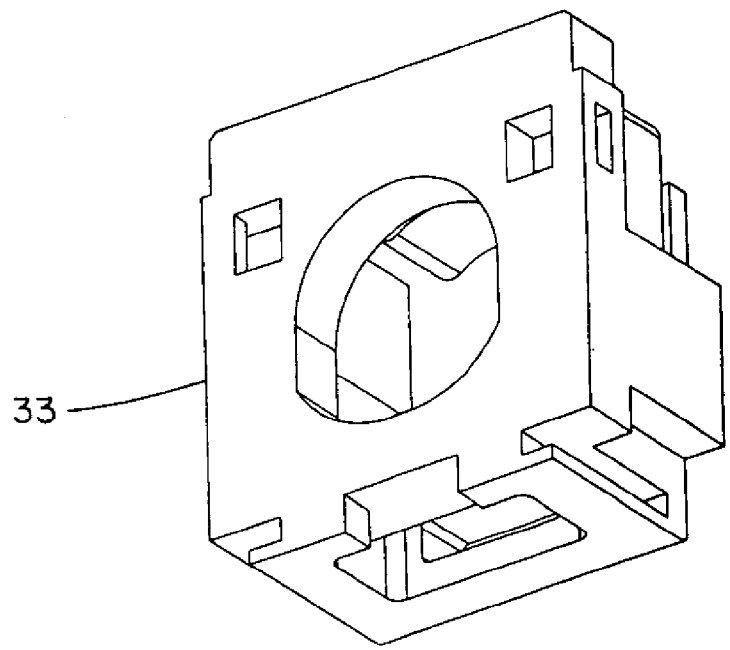

FIGS. 29a and 29b are perspective views of an alternate design of the metal portion 33 of the shielded wiring cap 31.

Figure 30A:
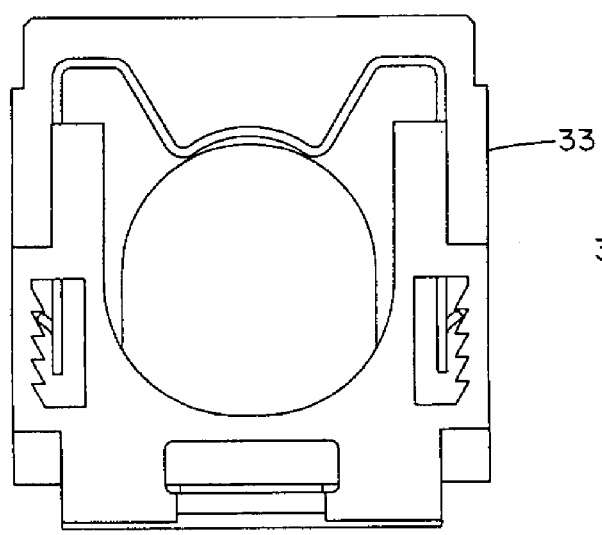
FIGS. 30a and 30b are end and side views of the grounding cap of FIG. 29.
Figure 30B:
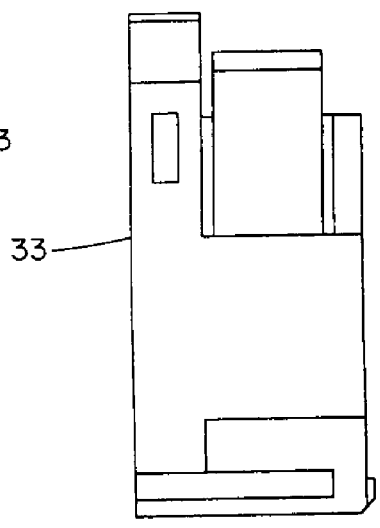

FIGS. 30a and 30b are end and side views of the metal portion 33 of cap 31.

The design of the shielded versions eliminates the need to install the shield in the field. When the cable is installed in the cap, the cable shield is connected to the metal portion of the cap.

When the cap is installed in the jack body, the metal portion 33 of the wiring cap 31 is connected to the jack shield.

This strain relief/grounding cap assembly provides a means to secure a shielded cable to a jack and to electrically connect the shield of an installed cable to the shield of the jack. This design accommodates a large range of cable diameters.

Installation of the strain relief/grounding cap assembly:
1. Cable is prepared per the following instructions:
   remove jacket, 1½"–2"
   fold back the braid over the jacket—wrap excess around jacket
   locate pairs per cap/conductor orientation (e.g. 568B)
2. Conductor pairs are fed through the grounding cap and oriented, foil shields are cut off where each wire will enter wire slot, wires are bent 90 degrees, inserted in wire slots, and cut off.
3. Cap assembly is located in the back of the jack housing and pressed in with an installation tool or pliers (not shown).
4. The spring clip is fully engaged with a pliers or the like to ensure good contact between the braid of the cable and the grounding cap.
5. The ground is connected from the cable/overbraid by clip/grounding cap to spring tabs on the housing shield.

Figure 31:
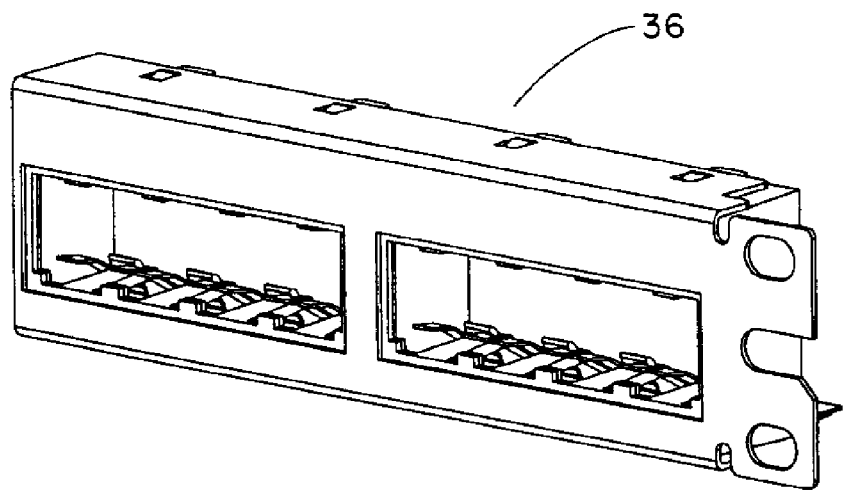
FIG. 31 is a front perspective view of a "shielded patch panel" for use with the shielded jack of FIG. 27.

FIG. 31 is a perspective front view of a "shielded patch panel" 36 for use with a shielded jack such as shown in FIG. 27.

Figure 32:
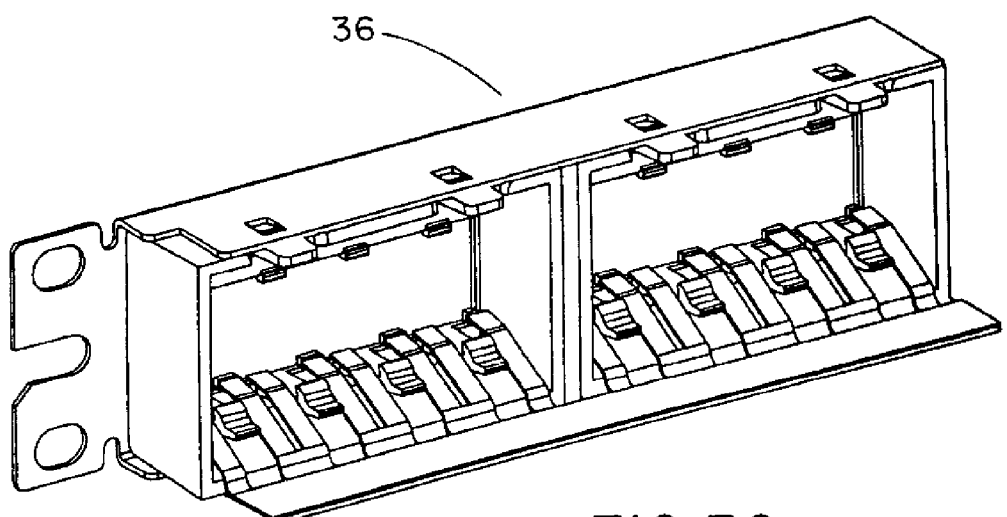
FIG. 32 is a rear perspective view of a "shielded patch panel" of FIG. 31.

FIG. 32 is a perspective rear view of the patch panel 36 shown in FIG. 31.

Figure 33:
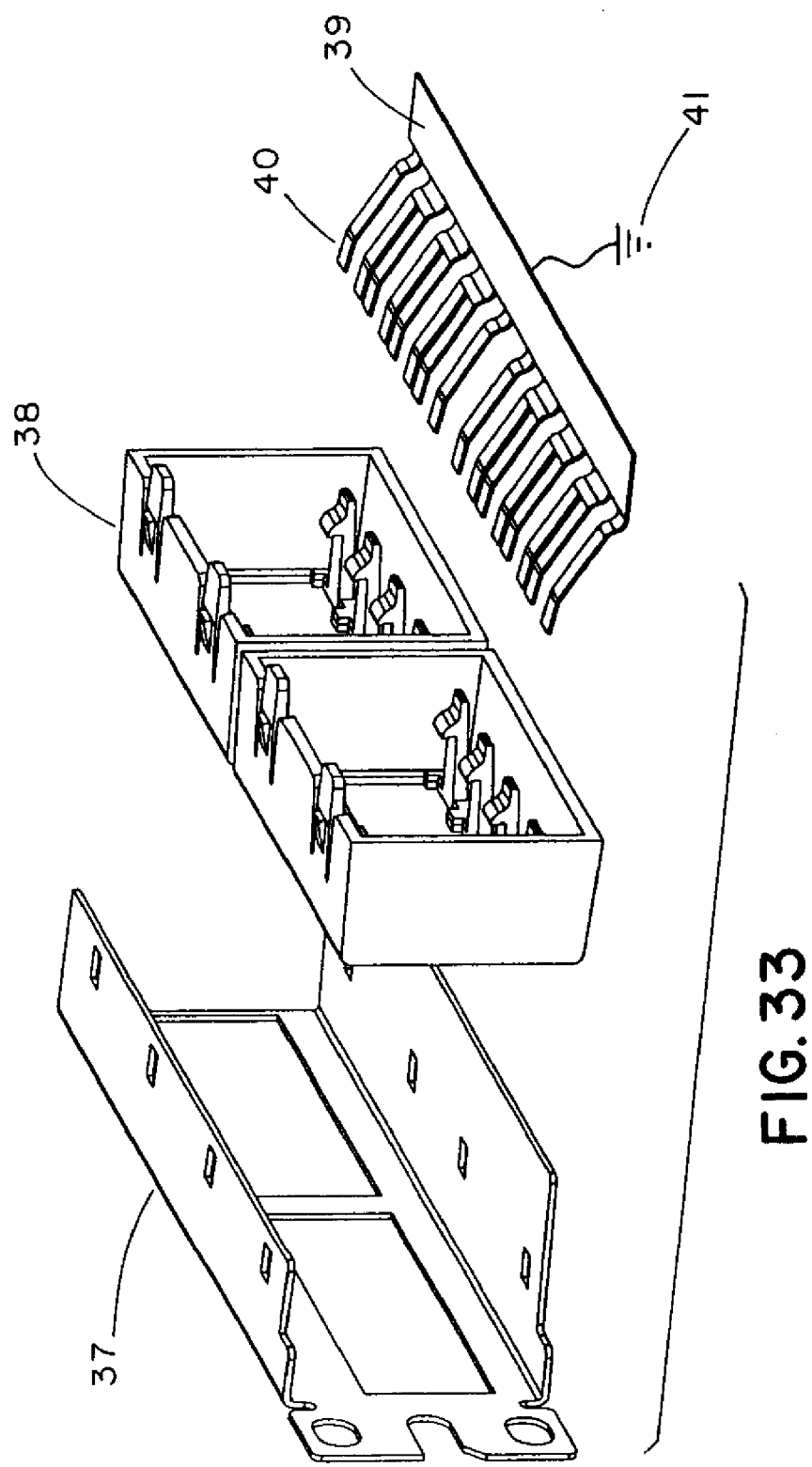
FIG. 33 is an exploded perspective view of the "shielded patch panel" of FIG. 31.

FIG. 33 is an exploded perspective rear view of the patch panel 36.

The components include a metal frame 37, plastic inserts 38, spring metal grounding strip 39 with grounding fingers 40 a means to ground the strip 39 to the network ground 41 (not shown).

Figure 34A:
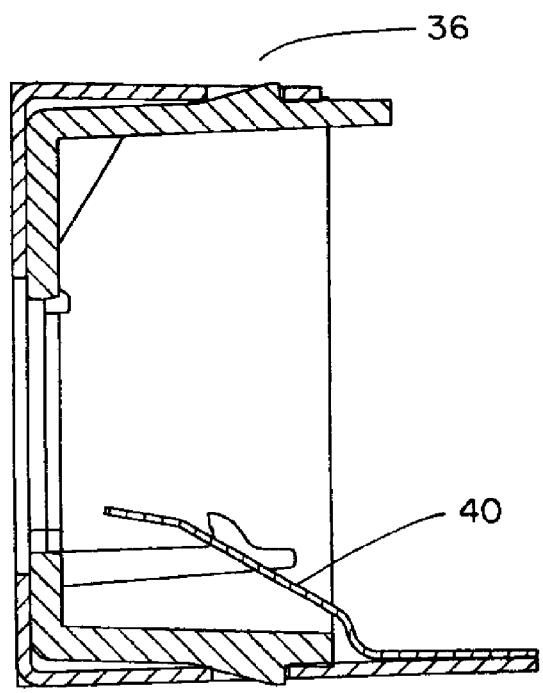
FIGS. 34a and 34b are side cross-sectional views of the "shielded patch panel" of FIG. 31.

FIG. 34a is a side cross-sectional view of the patch panel 36.

Figure 34B:
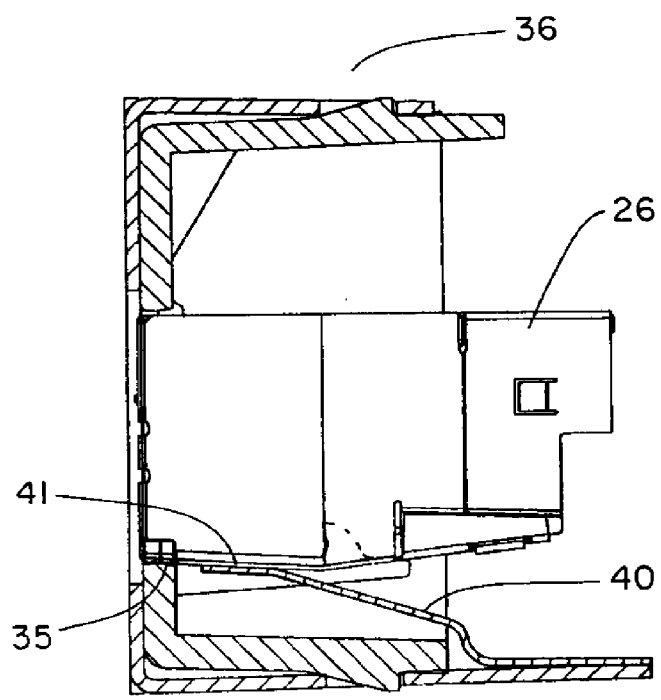

FIG. 34b is a side cross-sectional view of the patch panel 36 with a typical shielded jack 26 installed with a grounding finger 40 pressing against the jack shield 35 at location 41.

What is claimed is:

1. A jack connector for terminating a network cable that includes at least two pairs of conductors, the first pair comprising first and second conductors and the second pair comprising third and fourth conductors, the jack connector comprising:

a printed circuit board (PCB) with a plurality of electrical traces, wherein first, second, third, and fourth electrical traces are provided respectively for each of the first, second, third, and fourth conductors, wherein each electrical trace passes through at least two inductive coupling zones separated by a neutral zone that is substantially void of any intentionally introduced inductive coupling between adjacent electrical traces, wherein the at least two inductive coupling zones comprise a compensation zone and a crosstalk zone, wherein the compensation zone comprises inductive couplings between the second and third electrical traces and between the first and fourth electrical traces, and wherein the crosstalk zone comprises inductive couplings between the second and fourth electrical traces and between the first and third electrical traces.

2. The jack connector of claim 1, wherein the at least two inductive coupling zones along each electrical trace jointly offset in magnitude and phase an inductive coupling caused by a plug and a contact between the plug and the jack connector.

3. The jack connector of claim 1, wherein a length of the respective electrical traces within each of the respective inductive coupling zones is chosen so that inductive coupling provided by the inductive coupling zones combines to substantially offset an inductive coupling between the jack connector and a plug.

4. The jack connector of claim 1, wherein an electrical path formed by a conductor within a plug inserted into the jack connector extends from the plug through a portion of a contact between the plug and the jack connector, through a contact through-hole on the PCB, along a precompensation portion of a trace that is substantially void of any intentionally introduced inductive coupling between adjacent electrical traces, into the compensation zone of the trace, into the neutral zone of the trace, into the crosstalk zone of the trace and into a corresponding network cable conductor.

5. The jack connector of claim 4, wherein traces are run closely together in the compensation and crosstalk zones so as to introduce inductive coupling between particular trace pairs.

6. The jack connector of claim 1, wherein the PCB further comprises capacitive plates above and below a trace section that includes a plurality of trace leads.

7. The jack connector of claim 6, wherein the capacitive plates result in capacitive couplings, magnitudes of the capacitive couplings being determined by lengths of the capacitive plates parallel to the trace section.

8. The jack connector of claim 1, further comprising:

an electrically conducting pair divider that separates the network cable electrical conductors to reduce crosstalk between the electrical conductors within the jack connector.

9. The jack connector of claim 1, further comprising:

an electrically conducting cable clamp that forms an electrical connection with a shielding layer of the network cable.

10. The jack connector of claim 9, wherein the electrically conducting cable clamp further includes a contact that forms an electrical connection with a grounding plate upon insertion of the jack connector within a grounded patch panel.

* * * * *